(12) United States Patent
Song et al.

(10) Patent No.: US 8,383,449 B2
(45) Date of Patent: Feb. 26, 2013

(54) METHOD OF FORMING A THIN FILM TRANSISTOR HAVING OPENINGS FORMED THEREIN

(75) Inventors: Keun-Kyu Song, Yongin-si (KR);
Tae-Young Choi, Seoul (KR);
Tae-Hyung Hwang, Seoul (KR);
Seung-Hwan Cho, Suwon-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 12/857,442

(22) Filed: Aug. 16, 2010

(65) Prior Publication Data
US 2010/0311196 A1   Dec. 9, 2010

Related U.S. Application Data

(62) Division of application No. 11/580,622, filed on Oct. 12, 2006, now Pat. No. 7,800,101.

(30) Foreign Application Priority Data

Jan. 5, 2006   (KR) .................. 10-2006-0001238
Mar. 27, 2006  (KR) .................. 10-2006-0027427

(51) Int. Cl.
*H01L 21/336* (2006.01)

(52) U.S. Cl. ....... 438/82; 257/40; 257/72; 257/E21.409; 257/E51.023; 257/E51.052; 438/30; 438/34; 438/99

(58) Field of Classification Search .............. 257/40, 257/72, 347, E51.001, E51.018, E51.023, 257/E51.052, E21.409; 438/82, 30, 34, 99
See application file for complete search history.

(56) References Cited

U.S. PATENT DOCUMENTS

| | | | |
|---|---|---|---|
| 6,048,446 A | 4/2000 | Michaelis | |
| 6,528,816 B1 * | 3/2003 | Jackson et al. | 257/40 |
| 6,616,496 B1 | 9/2003 | Lu | |
| 2002/0012080 A1 | 1/2002 | Ishihara et al. | |
| 2005/0287692 A1 * | 12/2005 | Kim et al. | 438/30 |
| 2006/0081849 A1 | 4/2006 | Lee et al. | |
| 2006/0223222 A1 | 10/2006 | Choi et al. | |

FOREIGN PATENT DOCUMENTS

| | | |
|---|---|---|
| CN | 1312958 | 9/2001 |
| CN | 1398007 | 2/2003 |
| JP | 2002108250 A | 4/2002 |
| JP | 2002117756 | 4/2002 |
| JP | 2002352950 A | 12/2002 |
| JP | 2003223989 | 8/2003 |
| JP | 2003266003 A | 9/2003 |
| JP | 2004200304 A | 7/2004 |
| JP | 2004297011 A | 10/2004 |
| JP | 2005032759 A | 2/2005 |
| JP | 2005079598 A | 3/2005 |
| JP | 2005142474 A | 6/2005 |

(Continued)

*Primary Examiner* — Lynne Gurley
*Assistant Examiner* — Vernon P Webb
(74) *Attorney, Agent, or Firm* — Innovation Counsel LLP

(57) ABSTRACT

A thin film transistor array panel includes a substrate, a plurality of first and second signal lines crossing each other on the substrate, source electrodes connected to the first signal lines, drain electrodes connected to the second signal lines, pixel electrodes connected to the drain electrodes, a first partition formed on the source and drain electrodes and having a first opening, wherein a lower width of the first opening is wider than an upper width of the first opening, an organic semiconductor formed in the first opening and at least overlapping the portions of the source electrode and the drain electrode, and a gate electrode connected to the second signal line and at least overlapping the portion of the organic semiconductor.

12 Claims, 29 Drawing Sheets

FOREIGN PATENT DOCUMENTS

| | | |
|---|---|---|
| JP | 2005148391 | 6/2005 |
| JP | 2005211770 A | 8/2005 |
| KR | 1020010053038 A | 6/2001 |
| KR | 10-2001-0077571 A | 8/2001 |
| KR | 10-2001-0109639 A | 12/2001 |
| KR | 10-2003-0012813 A | 2/2003 |
| KR | 10-2004-0017729 A | 2/2004 |
| KR | 2004-0102174 | 12/2004 |

\* cited by examiner

METHOD OF FORMING A THIN FILM TRANSISTOR HAVING OPENINGS FORMED THEREIN

CROSS-REFERENCE TO RELATED APPLICATION

This application is a divisional of U.S. patent application Ser. No. 11/580,622 filed on Oct. 12, 2006, which claims priority to and the benefit of Korean Patent Applications Nos. 10-2006-0001238 and 10-2006-0027427 filed in the Korean Intellectual Property Office on Jan. 5, 2006 and Mar. 27, 2006, the contents of which are incorporated herein by reference.

FIELD OF THE INVENTION

The present invention relates to a thin film transistor array panel and a manufacturing method therefor.

DESCRIPTION OF THE RELATED ART

Generally, flat panel displays such as a liquid crystal display (LCD), an organic light emitting diode (OLED) display, and an electrophoretic display include a pair of electric-field generating electrodes with an electro-optical active layer disposed between the electrodes. The LCD uses a liquid crystal layer while the OLED display includes an organic light emitting layer as the electro-optical active layer that converts the electric field into optical images. One of the pair of field generating electrodes is connected to a switching element to receive electrical signals.

A thin film transistor (TFT) having three terminals is often used as the switching element, receiving gate control signals at its control electrode, data signals at its source electrode and delivering the data signals to its drain electrode which is connected to a pixel electrode of the display. The organic thin film transistors (OTFT) uses an organic semiconductor instead of the conventional inorganic Si semiconductor. An OTFT panel may be manufactured by a solution process such as inkjet printing.

In the inkjet printing method, an organic solution is dripped into openings defined by a plurality of partitions to form organic thin films for forming semiconductors or insulating layers. However, it has been difficult to provide organic thin films having uniform thicknesses using inkjet printing which ultimately affects the characteristics of the thin film transistor so produced.

SUMMARY OF THE INVENTION

A thin film transistor array panel according to an embodiment of the present invention includes a substrate, a plurality of first and second signal lines crossing each other on the substrate, source electrodes connected to the first signal lines, drain electrodes connected to the second signal lines, pixel electrodes connected to the drain electrodes, a first partition formed on the source and the drain electrodes and having a first opening wherein a lower width of the first opening is wider than an upper width of the first opening, an organic semiconductor formed in the first opening and at least overlapping the portions of the source electrode and the drain electrode, and a gate electrode connected to the second signal line and at least overlapping the portion of the organic semiconductor.

In accordance with an important aspect of the invention, a partition, layer, advantageously made of a photosensitive organic insulator formed by a solution process, such as inkjet printing, and having a thickness from about 5000 Å to about 4 microns, is formed on the source electrodes, pixel electrodes, and an interlayer insulating layer. The partition layer includes a plurality of openings having an inverse tapered structure according to which the lower width of the openings wider than the upper width so that the surfaces of source and drain electrodes make an acute angle with the slanted surfaces of the openings in the partition. A plurality of organic semiconductor islands are formed in the openings, advantageously by a solution process in which an organic solution is supplied and then dried thereby allowing the semiconductor solution to adhere closely to and fill-in the openings and causing the islands to have the same shape as those of the openings. The bottom of the solution entered into the openings has different volatilization velocity than the top, causing the bottom, thicker portion of the resultant organic semiconductor island to be filled-in and have a uniform thickness where the channel of the thin film transistor is formed. Accordingly, although the organic semiconductor islands are formed by the solution process such as inkjet printing, the channel portion of the organic semiconductor islands will have uniform thickness thereby providing a thin film transistor having good characteristics.

A method of manufacturing a thin film transistor array panel according to another embodiment includes forming a data line on a substrate, forming an interlayer insulating layer covering the data line and having a first contact hole, forming a gate line on the interlayer insulating layer, forming a first partition having an inverse tapered structure and a first opening on the gate line, forming a gate insulator in the first opening, forming a source electrode and a pixel electrode having a drain electrode opposing the source electrode on the gate insulator and the first partition, forming a second partition having an inverse tapered structure and a second opening on the source electrode and the pixel electrode, and forming an organic semiconductor in the second opening.

BRIEF DESCRIPTION OF THE DRAWING

The foregoing and other objects, features and advantages of the present invention may become more apparent from the ensuing description when read together with the drawings, in which.

DETAILED DESCRIPTION

Figure 1:
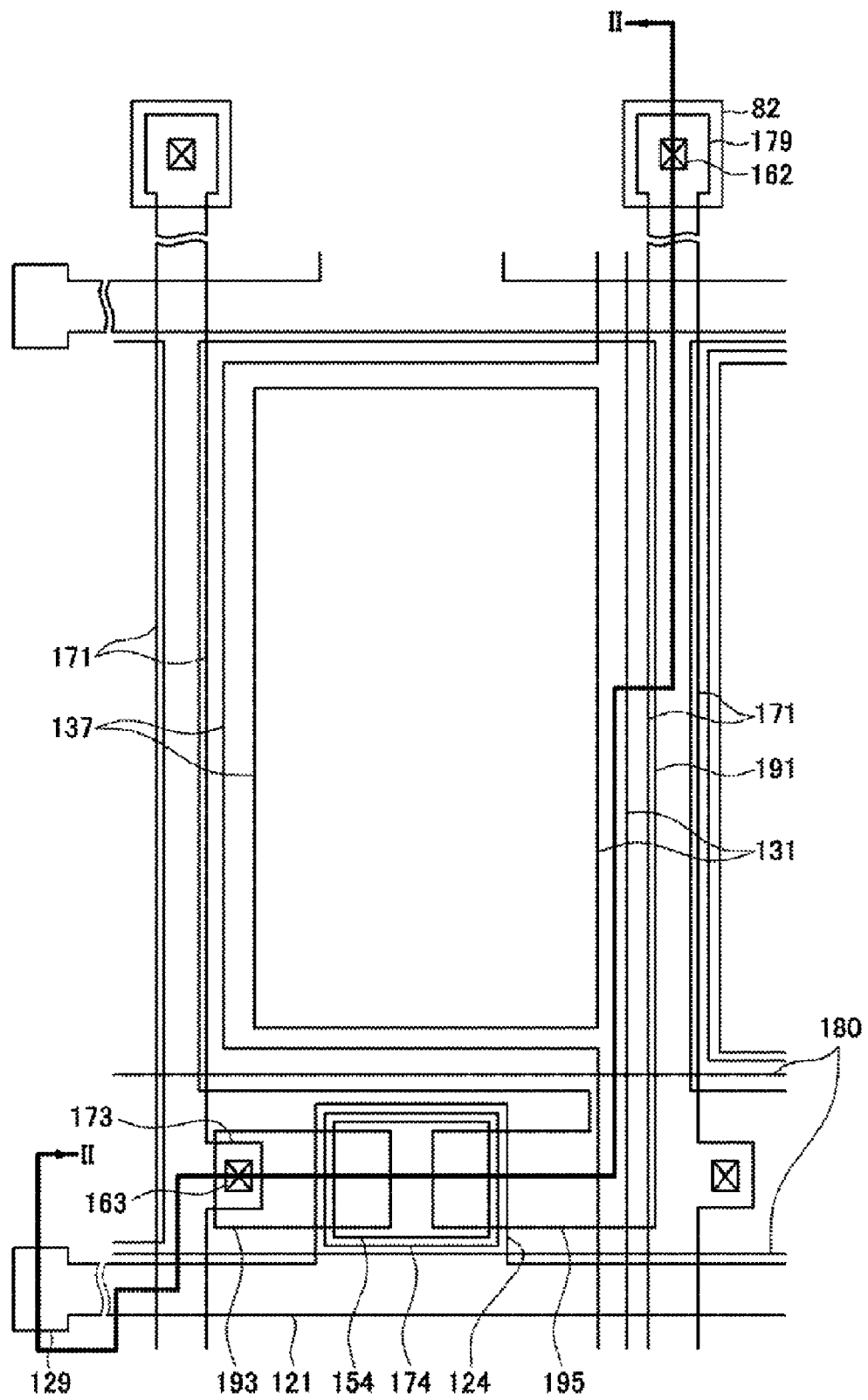
FIG. 1 is a layout view of an OTFT array panel according to an embodiment of the present invention.

In the drawing, the thickness of layers and regions are exaggerated for clarity. It will be understood that when an element such as a layer, region, or substrate is referred to as being "on" another element, it can be directly on the other element or intervening elements may also be present. In contrast, when an element is referred to as being "directly on" another element, there are no intervening elements present.

Figure 2:
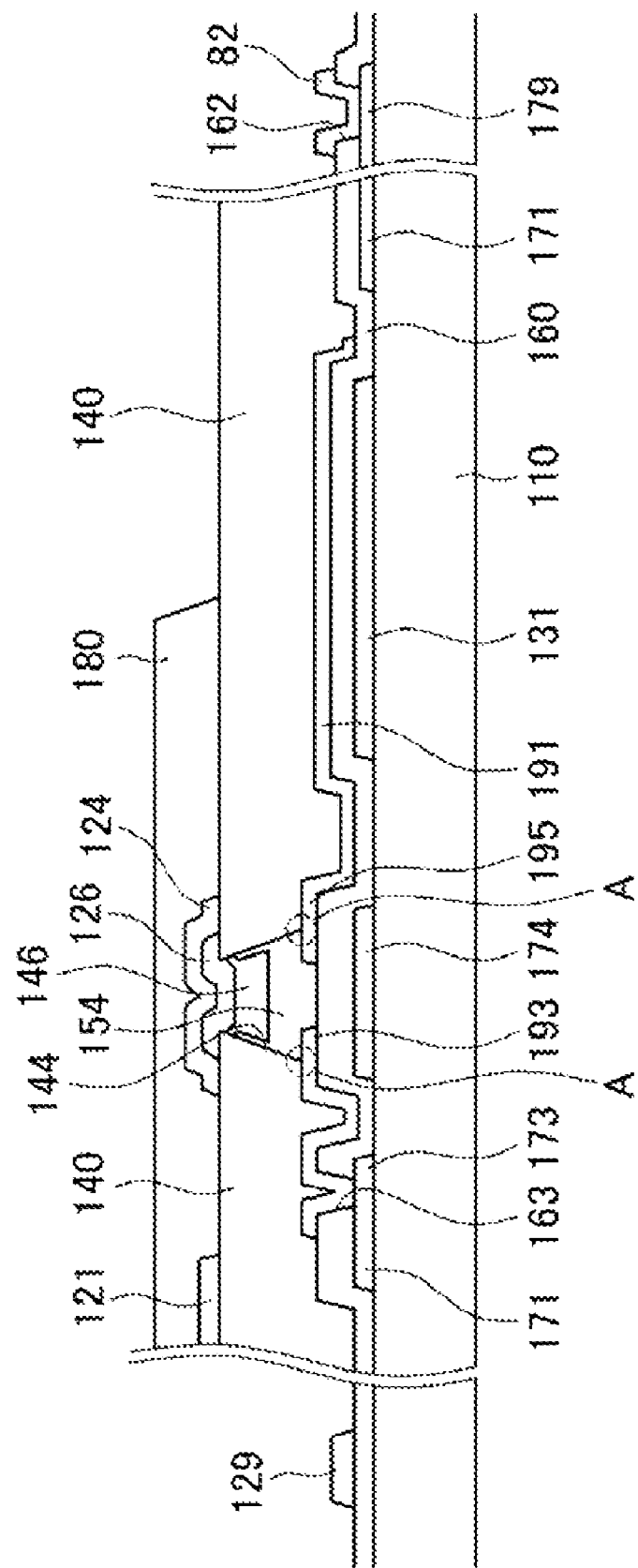
FIG. 2 is a sectional view of the OTFT array panel shown in FIG. 1 taken along the line II-II.

As shown in FIGS. 1 and 2, a plurality of data lines 171, a plurality of storage electrode lines 131, and a plurality of light blocking layers 174 are formed on an insulating substrate 110 made of a material such as transparent glass, silicone, or plastic.

Data lines 171 transmit data signals and extend substantially in a longitudinal direction. Each data line 171 includes a plurality of projections 173 protruding aside, and an end portion 179 having a large area for contact with another layer or an external driving circuit. A data driving circuit (not shown) for generating the data signals may be mounted on a flexible printed circuit (FPC) film (not shown), which may be attached to the substrate 110, directly mounted on the substrate 110, or integrated on the substrate 110. Data lines 171 may extend to connect to a driving circuit that may be integrated on the substrate 110.

Storage electrode lines 131 are supplied with a predetermined voltage and extend substantially parallel to data lines 171. Each of storage electrode lines 131 is disposed between two adjacent data lines 171 and is closer to the right one of the two adjacent data lines 171. Each of storage electrode lines 131 includes a storage electrode 137 expanding left and right. However, storage electrode lines 131 may have various shapes and arrangements. Light blocking layers 174 are separated from data lines 171 and storage electrode lines 131.

Data lines 171, storage electrode lines 131, and light blocking layers 174 are preferably made of a metal including Al or an Al alloy, Ag or a Ag alloy, Au or a Au alloy, Cu or a Cu alloy, Mo or a Mo alloy, Cr, Ta, or Ti. The conductors may have a multi-layered structure including two conductive films (not shown) having different physical characteristics. One of the two films is preferably made of a low resistivity metal for reducing signal delay or voltage drop. However, data lines 171, storage electrode lines 131, and the blocking layers 174 may be made of various metals or conductors.

The lateral sides of data lines 171, storage electrode lines 131, and light blocking layers 174 are inclined relative to a surface of substrate 110, and the inclination angle thereof ranges from about 30 to 80 degrees.

An interlayer insulating layer 160 is formed on data lines 171, storage electrode lines 131, and light blocking layers 174. Interlayer insulating layer 160 may be made of an inorganic insulator. Examples of the inorganic insulator include silicon nitride (SiNx) and silicon oxide (SiOx). The thickness of interlayer insulating layer 160 may be from about 2000 Å to about 4 microns.

Interlayer insulating layer 160 has a plurality of contact holes 162 exposing the end portions 179 of data lines 171 and a plurality of contact holes 163 exposing the projections 173 of data lines 171.

A plurality of source electrodes 193, a plurality of pixel electrodes 191, and a plurality of contact assistants 82 are formed on interlayer insulating layer 160.

Source electrodes 193 are connected to projections 173 of data lines 171 through contact holes 163, and may have an island shape.

Each of the pixel electrodes 191 includes a drain electrode 195 disposed opposite the source electrode 193 that receives a data signal. Also, pixel electrodes 191 include a plurality of portions at least overlapping storage electrode lines 131 for reinforcing the voltage storage capacity of the storage capacitor.

Contact assistants 82 are connected to the end portions 179 of data lines 171 through contact holes 162, respectively. Contact assistants 82 protect the end portions 179 and enhance the adhesion between the end portions 179 and external devices.

Source electrodes 193, pixel electrodes 191, and contact assistants 82 may be made of a transparent conductor such as ITO or IZO or a reflective conductor such as Ag, Al, Cr, or alloys thereof.

The difference in the work function between an organic semiconductor and the ITO layer or IZO layer may be so small that charge carriers can be effectively injected into the organic semiconductor from source electrode 193 and drain electrode 195 made of ITO or IZO. When the difference in the work function therebetween is small, a Schottky barrier generated between the organic semiconductor 154 and the electrodes 193 and 195 may easily allow the injection and transport of the charge carriers.

A partition 140 is formed on source electrodes 193, pixel electrodes 191, and interlayer insulating layer 160. Partition 140 may be made of a photosensitive organic insulator formed by a solution process. The thickness of insulating layer 140 may be from about 5000 Å to about 4 microns.

Partition 140 has a plurality of openings 144 exposing the portions of source electrodes 193 and drain electrodes 195 and interlayer insulating layer 160 therebetween.

Partition 140 has an inverse tapered structure with the center line of the openings 144. Accordingly, the lower width of the openings 144 is wider than the upper width thereof as shown in FIG. 2 and the surfaces of source and drain electrodes 193 and 195 make an acute angle with the slanted surface of partition 140 in the edge portions A.

A plurality of organic semiconductor islands 154 are formed in the openings 144 of partition 140. Organic semiconductor islands 154 can be formed by a solution process such as inkjet printing. The solution process includes steps in which an organic solution is supplied and the organic solution is dried. Because the organic semiconductor solution is adhered closely to partition 140 and is filled in the openings 144, organic semiconductor islands 154 have the same shapes as those of the openings 144. On the other hand, because the volatilization velocities between the upper portion and lower portion of partitions 140 are different, the thicknesses of the organic semiconductor islands 154 may be different between the upper portion and lower portion of organic semiconductor islands 154.

Because partition 140 has an inverse tapered structure, the thicker portion of organic semiconductor islands 154 is filled in the edge portions A and the center portion, in which the channel of the thin film transistor is formed, has a uniform thickness. Accordingly, although organic semiconductor islands 154 are formed by the solution process such as inkjet printing, the channel portion of the organic semiconductor islands 154 will have uniform thickness thereby providing a thin film transistor having good characteristics. Organic semiconductor islands 154 contact source electrodes 193 and drain electrodes 195. The height of organic semiconductor islands 154 is lower than that of partition 140 so as to be completely confined by partition 140. Since the lateral surfaces of organic semiconductor islands 154 are not exposed, chemicals used in later process steps are prevented from infiltrating the organic semiconductor islands.

Light blocking layer 174 protects organic semiconductor islands 154 from back light to prevent photo-leakage current.

Organic semiconductor islands 154 may include a high molecular weight compound or a low molecular weight compound that is soluble in an aqueous solution or an organic solvent.

Organic semiconductor islands 154 may be made of, or from, derivatives of tetracene or pentacene with a substituent. Alternatively, the organic semiconductor islands 154 may be made of an oligothiophene including four to eight thiophenes connected at the positions 2 and 5 of thiophene rings.

Organic semiconductor islands 154 may be made of polythienylenevinylene, poly 3-hexylthiophene, polythiophene, phthalocyanine, or metallized phthalocyanine, or halogenated derivatives thereof. Alternatively, organic semiconductor islands 154 may be made of perylene tetracarboxylic dianhydride (PTCDA), naphthalene tetracarboxylic dianhydride (NTCDA), or their imide derivatives. The organic semiconductor islands 154 may also be made of perylene, coronene, or derivatives thereof with a substituent.

The thickness of organic semiconductor islands 154 may be in the range of about 300 to 3000 angstroms.

A plurality of gate insulators 146 are formed on organic semiconductor islands 154. The sidewalls of the openings 144 are higher than the gate insulators 146 such that partition 140 provides a wall or bank against gate insulators 146.

Gate insulators 146 may be made of an inorganic insulator or an organic insulator. Examples of an organic insulator include a soluble high molecule weight compound such as a polyimide compound, a polyvinyl alcohol compound, and parylene. Examples of an inorganic insulator include silicon oxide that may have a surface treated with octadecyl-trichloro-silane (OTS).

A plurality of blocking members 126 are formed in gate insulators 146. Blocking members 126 protect the gate insulators 146 and the organic semiconductor islands 154, and may be made of ITO or IZO.

A plurality of gate lines 121 are formed on gate insulators 146 and partition 140.

Gate lines 121 transmit gate signals and extend substantially in a transverse direction to intersect data lines 171 and storage electrode lines 131. Each of gate lines 121 includes a plurality of gate electrodes 124 projecting upward and an end portion 129 having a large area for making contact with another layer or an external driving circuit. A gate driving circuit (not shown) for generating the gate signals may be mounted on an FPC film (not shown), which may be attached to the substrate 110, directly mounted on the substrate 110, or integrated on the substrate 110. The gate lines 121 may extend to connect to a driving circuit that may be integrated on the substrate 110.

Gate electrodes 124 overlap organic semiconductor islands 154 via the gate insulators 146, and have sufficient size to completely cover the blocking members 126. Blocking members 126 enhance the adhesion between gate electrodes 124 and gate insulators 146 and prevent gate electrodes 124 from lifting away.

Gate lines 121 may be made of a conductor material having low resistivity such as that of data lines 171 and storage electrode lines 131.

The lateral sides of the gate lines 121 are inclined relative to a surface of the substrate 110, and their inclination angles range from about 30 to about 80 degrees.

A gate electrode 124, a source electrode 193, a drain electrode 195, and an organic semiconductor island 154 form an organic TFT. The TFT has a channel formed in the organic semiconductor island 154 disposed between the source electrode 193 and the drain electrode 195.

Pixel electrodes 191 receive data voltages from the organic TFT and generate an electric field in conjunction with a common electrode (not shown) of an opposing display panel (not shown) that is supplied with a common voltage, which determines the orientations of liquid crystal molecules (not shown) in a liquid crystal layer (not shown) disposed between the two electrodes. A pixel electrode 191 and the common electrode form a capacitor referred to as a "liquid crystal capacitor," which stores applied voltages even after the organic TFT turns off.

A plurality of passivation members 180 are formed on gate electrodes 124. Passivation members 180 protect the organic TFT from external heat, plasma, and chemicals, and may partially or completely cover the substrate 110. The passivation members 180 may be omitted.

A method of manufacturing the OTFT array panel shown in FIGS. 1 and 2 according to an embodiment of the present invention will be described in detail with reference to FIGS. 3-14 as well as FIGS. 1 and 2.

Figure 3:
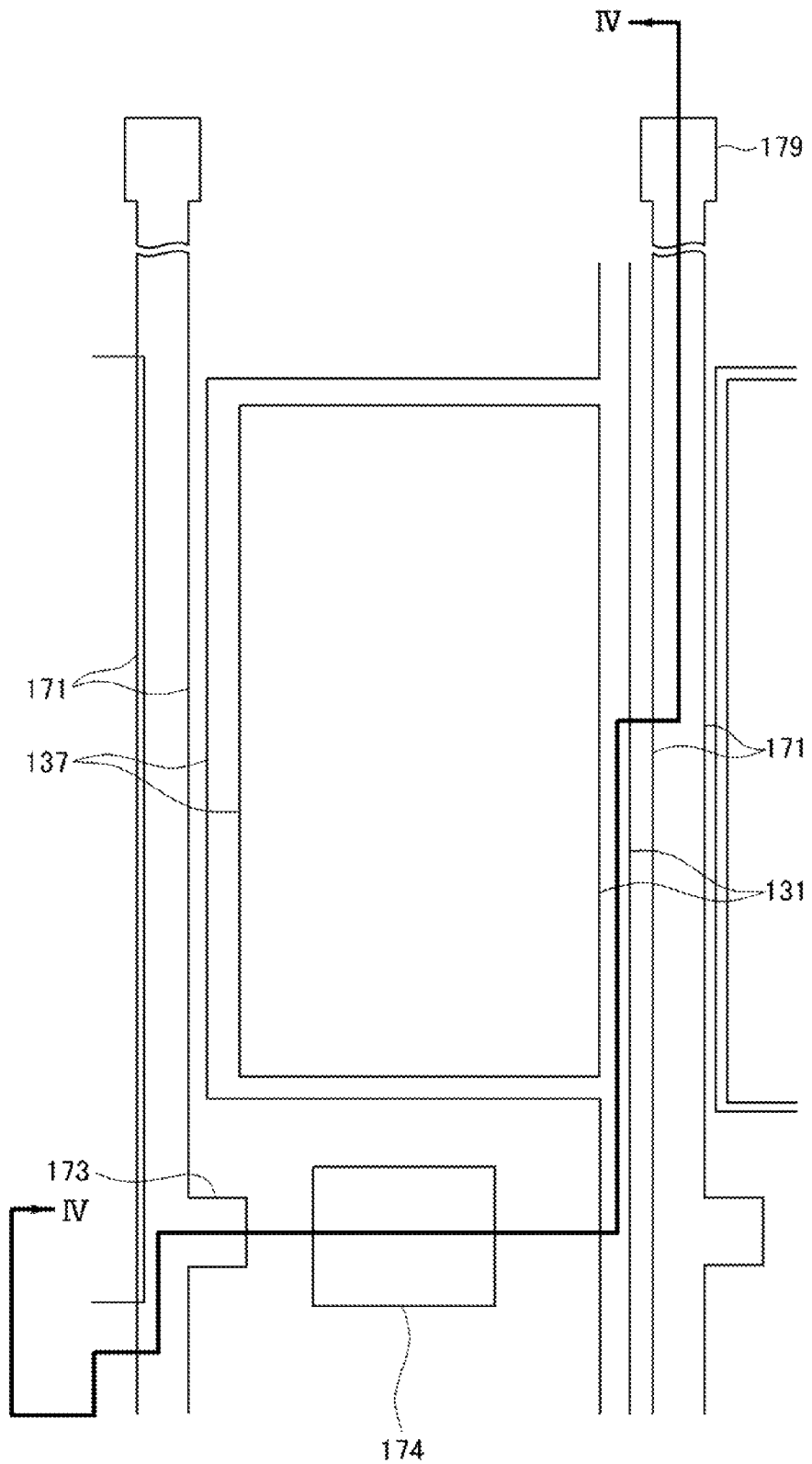
FIGS. 3, 5, 7, 11, and 13 are layout views of the OTFT array panel shown in FIGS. 1 and 2 in intermediate steps of a manufacturing method thereof according to an embodiment of the present invention.
Figure 4:
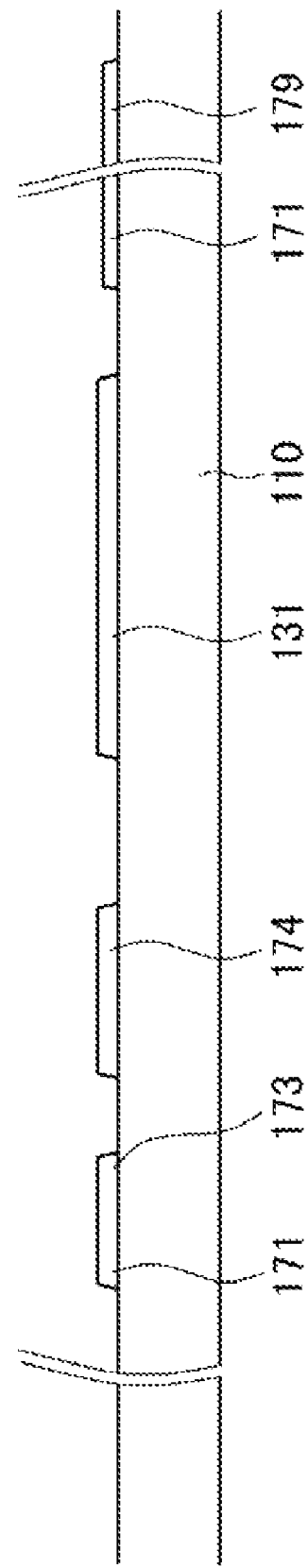
FIG. 4 is a sectional view of the OTFT array panel shown in FIG. 3 taken along the line IV-IV.
Figure 5:
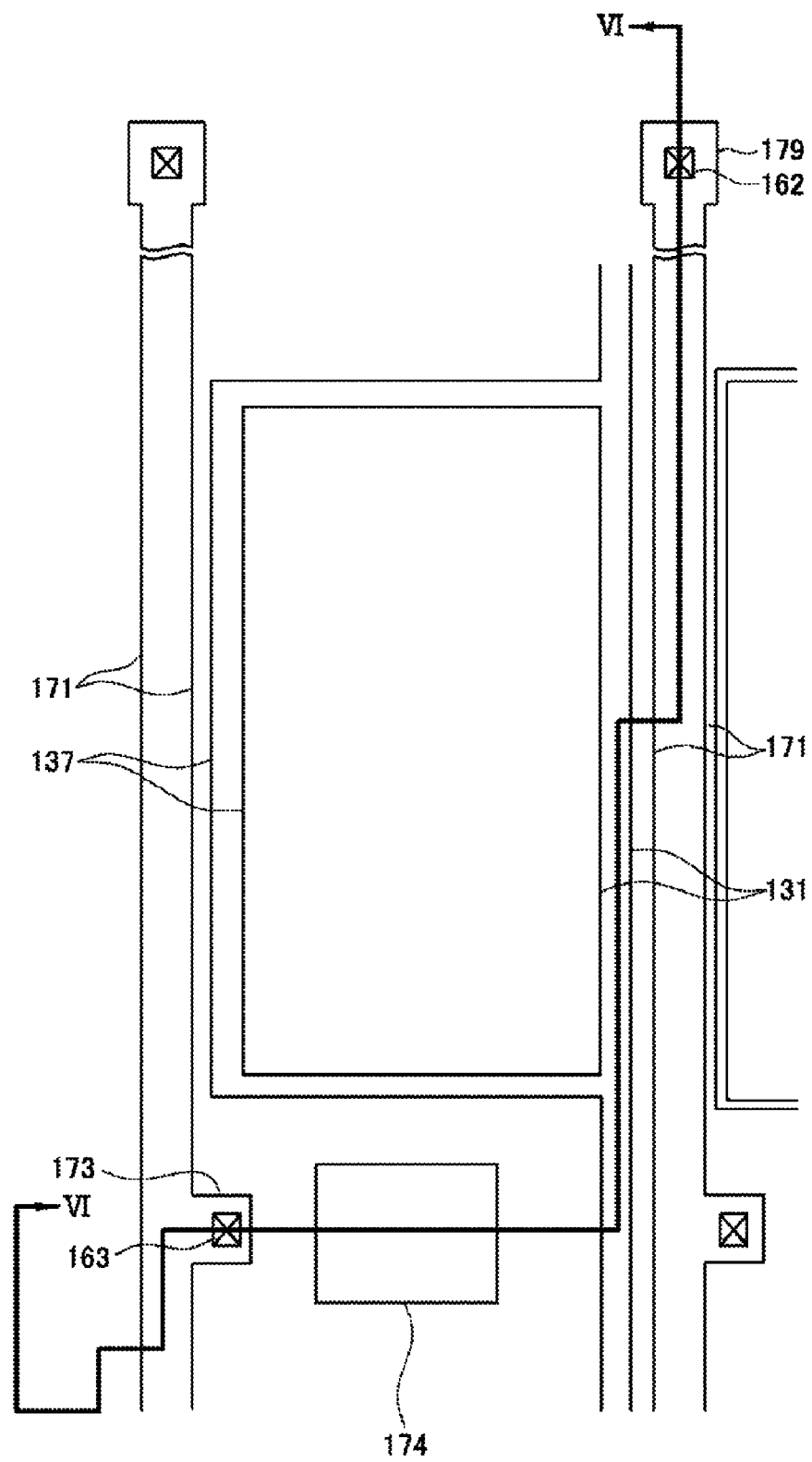
Figure 6:
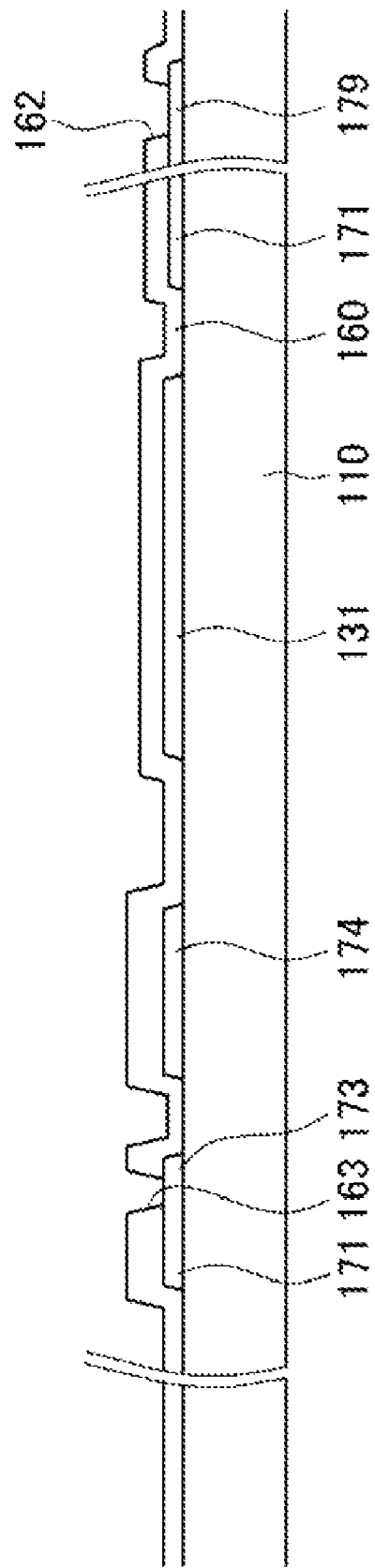
FIG. 6 is a sectional view of the OTFT array panel shown in FIG. 5 taken along the line VI-VI.
Figure 9:
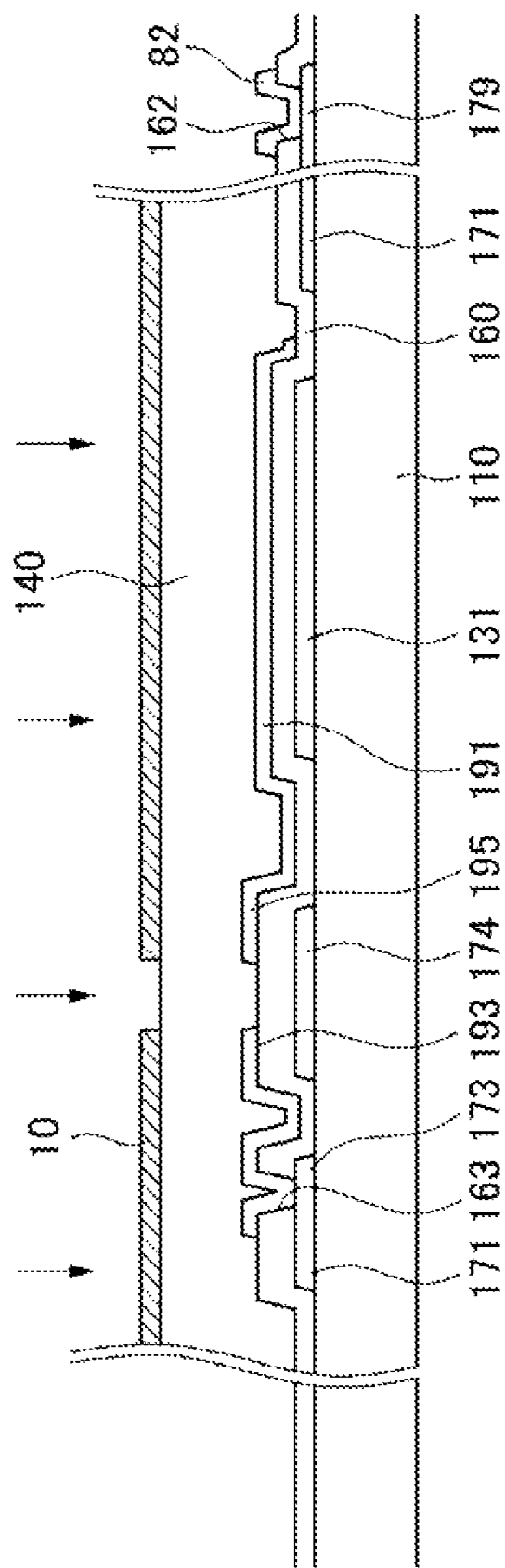
FIGS. 9 and 10 are sectionals view of the OTFT array panel following steps of FIG. 8.
Figure 10:
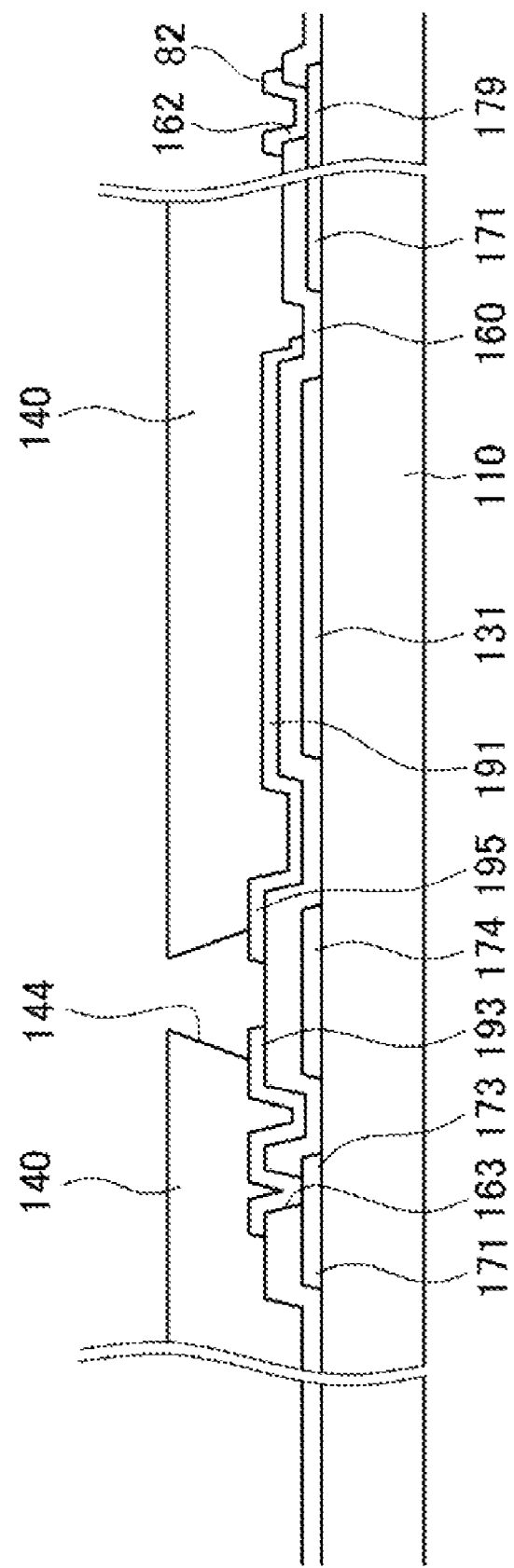

FIGS. 3, 5, 7, 11, and 13 are layout views of the OTFT array panel shown in FIGS. 1 and 2 in intermediate steps of a manufacturing method thereof according to an embodiment of the present invention, FIG. 4 is a sectional view of the OTFT array panel shown in FIG. 3 taken along the line IV-IV, and FIG. 6 is a sectional view of the OTFT array panel shown in FIG. 5 taken along the line VI-VI. FIG. 8 is a sectional view of the TFT array panel shown in FIG. 7 taken along the line VIII-VIII, FIGS. 9 and 10 are sectionals view of the OTFT array panel following steps of FIG. 8, FIG. 12 is a sectional view of the OTFT array panel shown in FIG. 11 taken along the line XII-XII, and FIG. 14 is a sectional view of the TFT array panel shown in FIG. 13 taken along the line XIV-XIV.

Referring to FIGS. 3 and 4, a conductive layer is deposited on a substrate 110 by using sputtering, etc., and is patterned by lithography and etching to form a plurality of data lines 171 including projections 173 and end portions 179, a plurality of storage electrode lines 131 including a plurality of storage electrodes 137, and a plurality of light blocking layers 174.

Referring to FIGS. 5 and 6, an interlayer insulating layer 160 including a plurality of contact holes 162 and 163 is formed by deposition and patterning. The deposition of interlayer insulating layer 160 is performed by CVD of an inorganic material such as silicon nitride.

Figure 7:
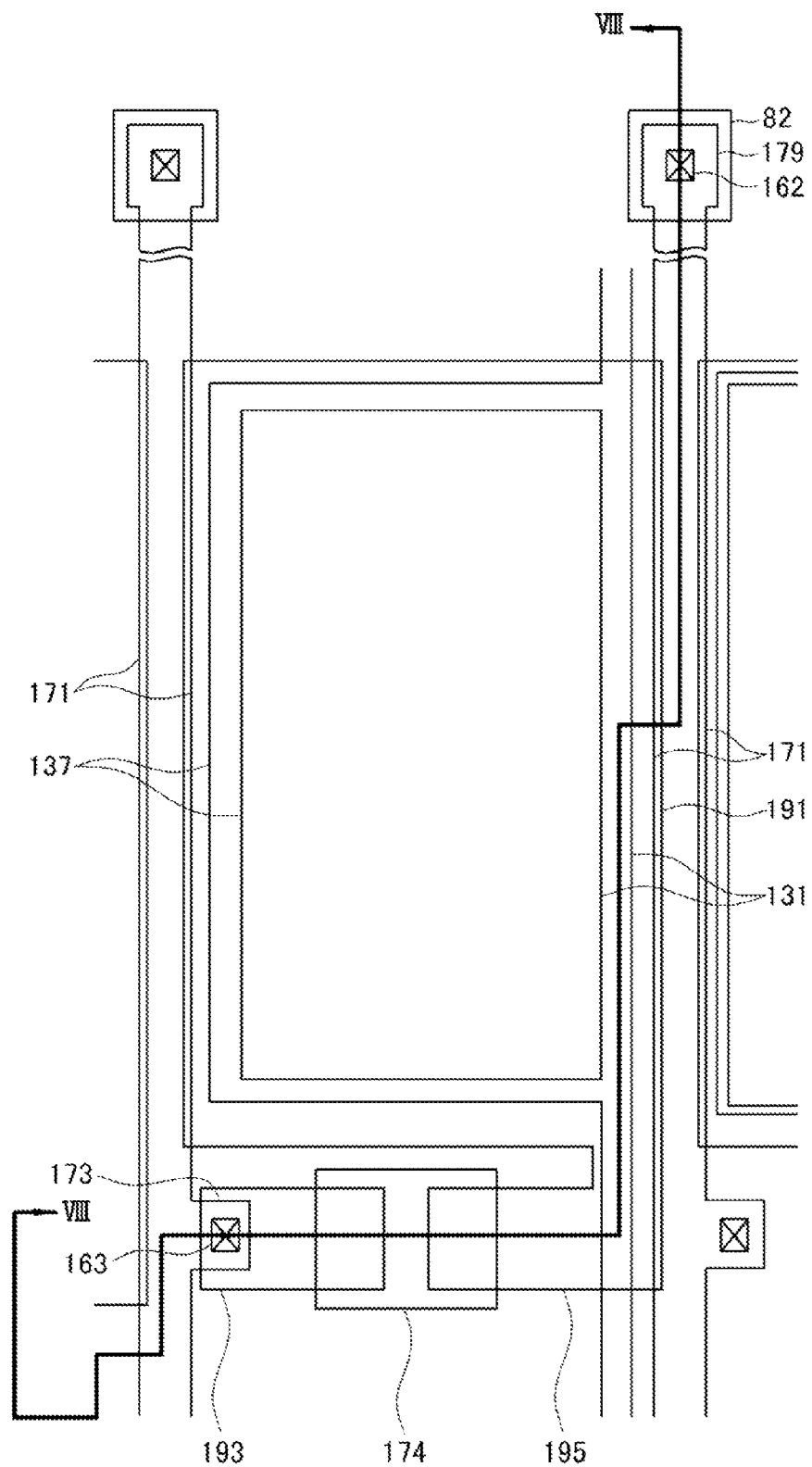
Figure 8:
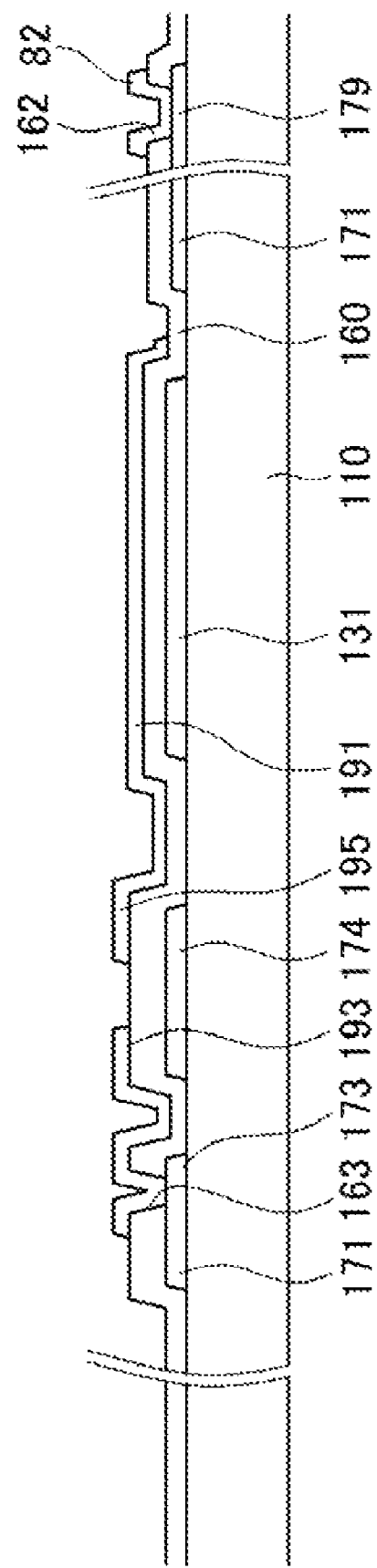
FIG. 8 is a sectional view of the TFT array panel shown in FIG. 7 taken along the line VIII-VIII.

Referring to FIGS. 7 and 8, an amorphous ITO layer is deposited by sputtering, etc., and patterned by lithography and etching to form a plurality of source electrodes 193, a plurality of pixel electrodes 191 including drain electrodes 195, and a plurality of contact assistants 82.

Subsequently, as shown in FIG. 9, an organic photosensitive layer is coated on the substrate 110 and a metal layer is deposited thereon. Next, the metal layer is etched to form a metal pattern 10. It is preferable that the metal pattern 10 is made of a different material from that of source electrodes 193 and the pixel electrodes 191.

Next, the organic photosensitive layer is dry-etched by using the metal pattern 10 as an etch mask to form a partition 140 having a plurality of openings 144. Partition 140 has an inverse tapered structured with respect to the center of the openings 144, as shown in FIG. 10.

As above-described, the inverse tapered structure is formed by dry etching, but a negative organic photosensitive material may be used to form a partition 140 having an inverse tapered structured.

Figure 11:
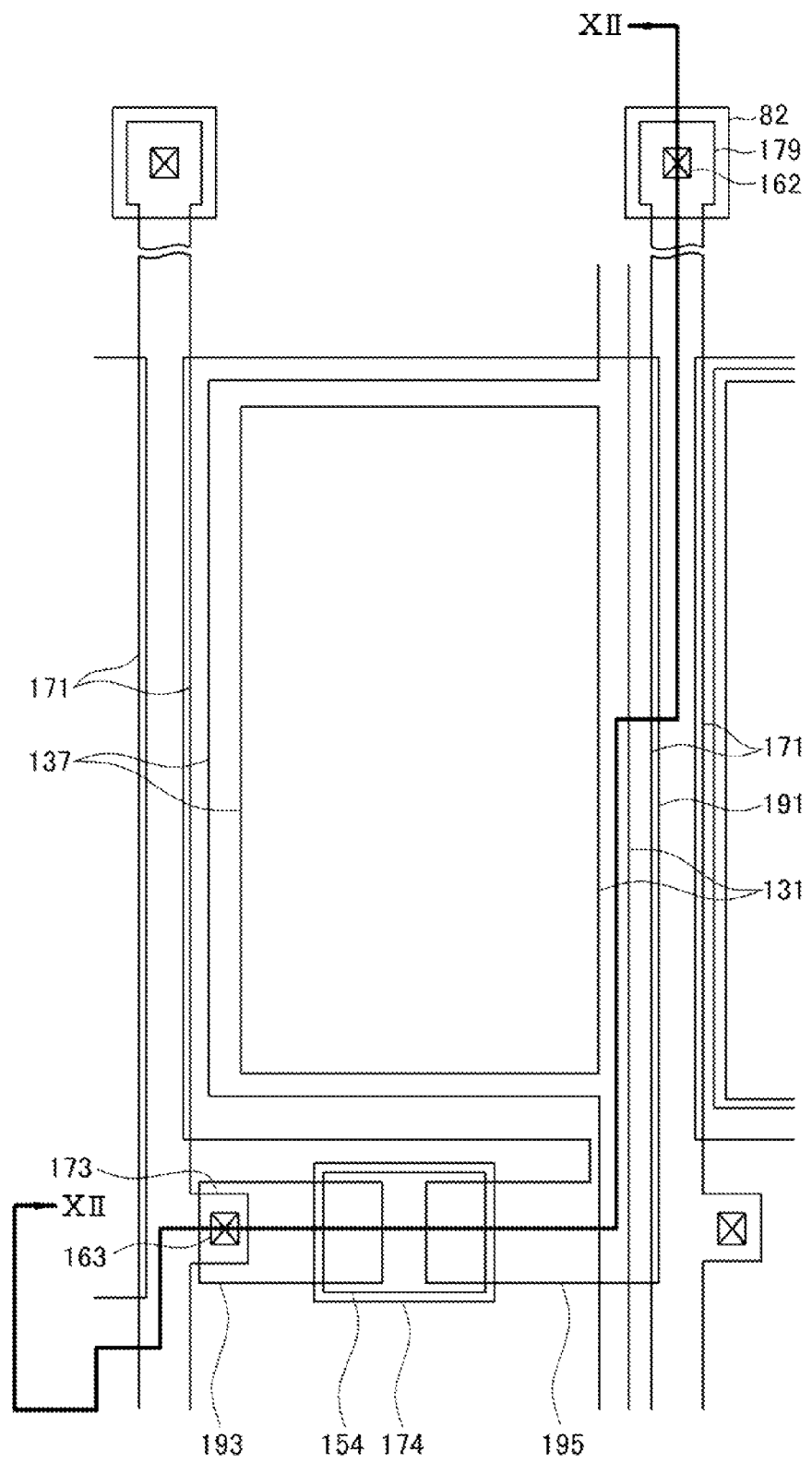
Figure 12:
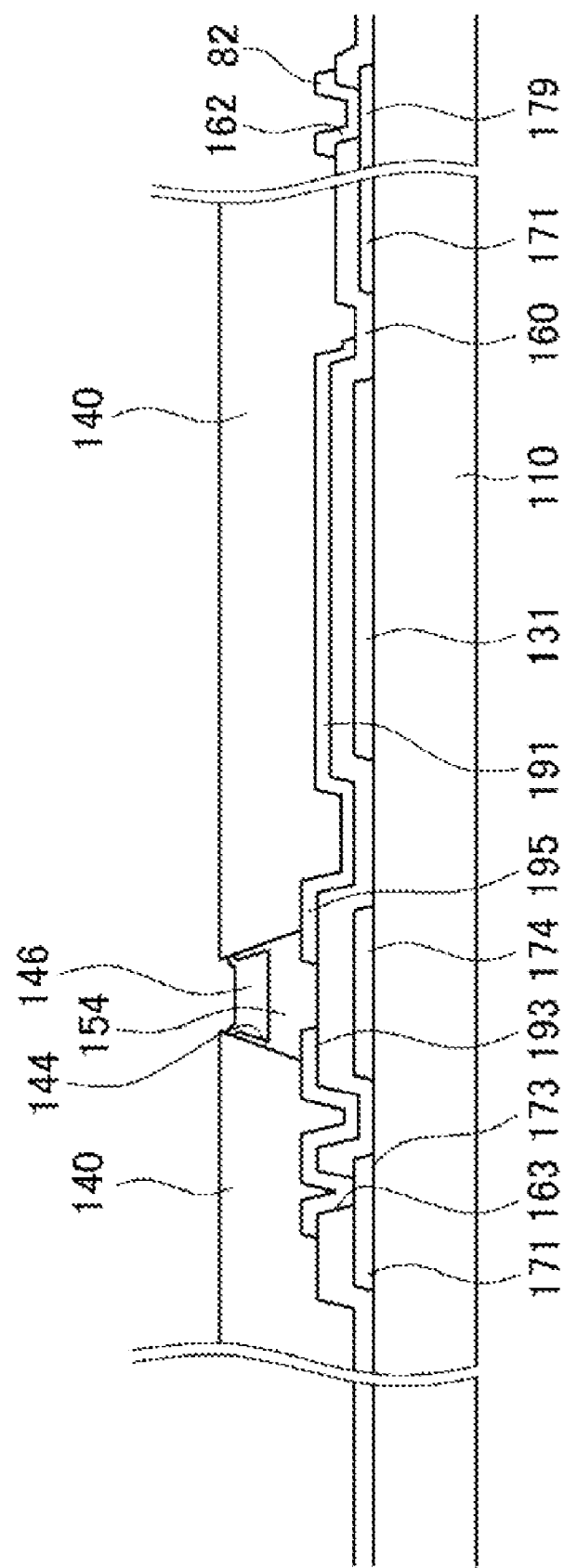
FIG. 12 is a sectional view of the OTFT array panel shown in FIG. 11 taken along the line XII-XII.

Referring to FIGS. 11 and 12, a plurality of organic semiconductor islands 154 are sequentially formed in the openings 144 by inkjet printing, etc. To form the organic semiconductor islands 154, a nozzle is firstly aligned on the openings 144, and an organic semiconductor solution is supplied and dried.

Successively, a plurality of gate insulators 146 are formed on the organic semiconductor islands 154 by inkjet printing, etc. The inkjet printing includes supplying and drying a gate insulating solution.

Figure 13:
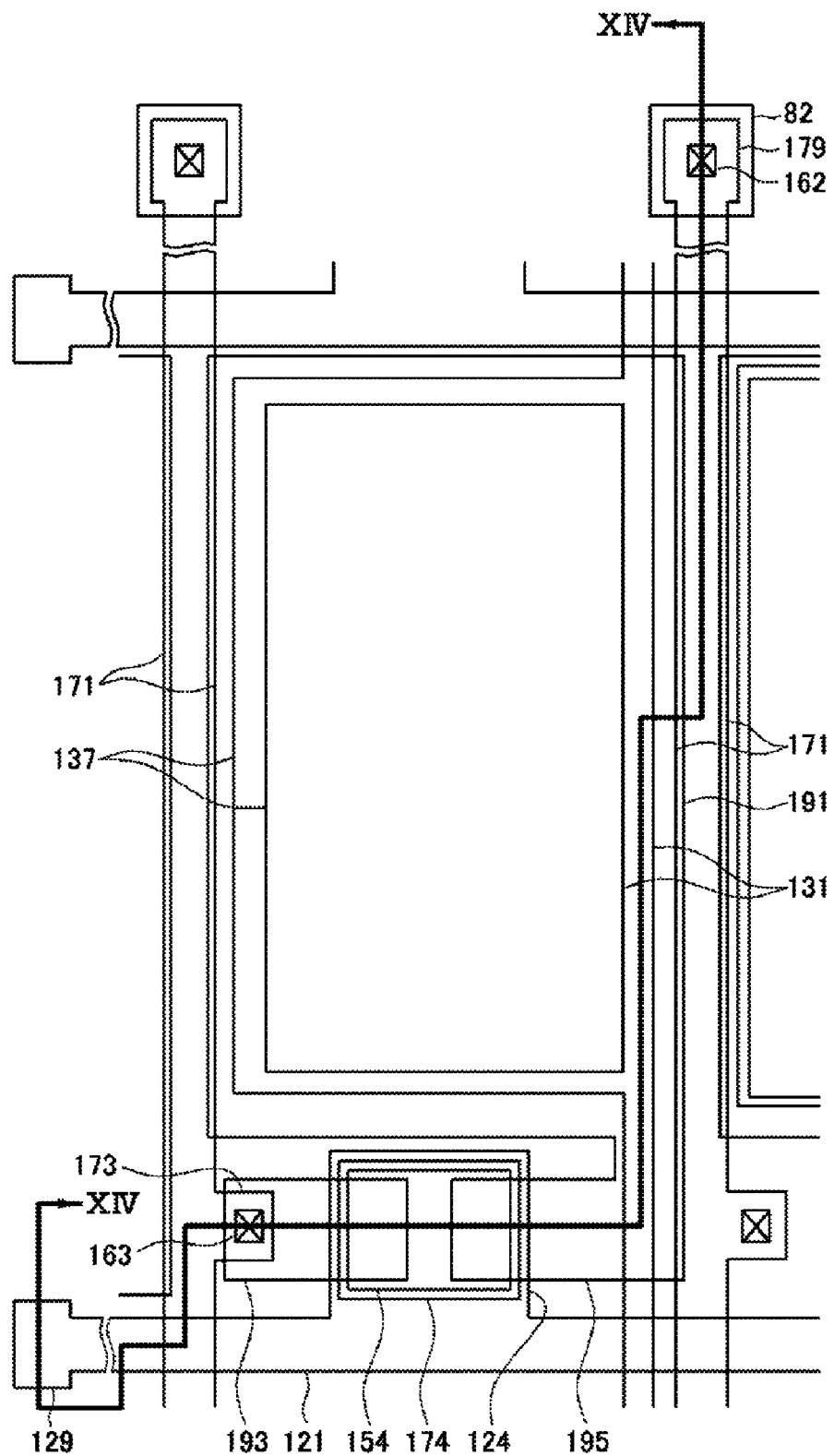
Figure 14:
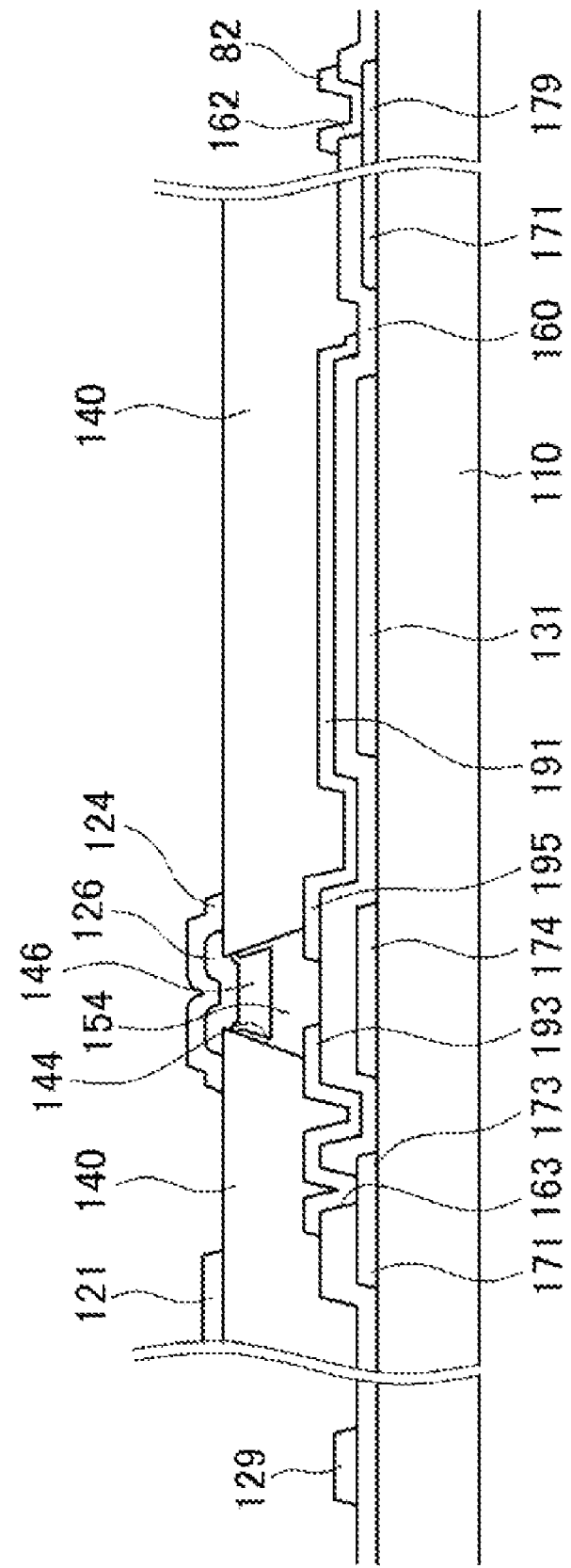
FIG. 14 is a sectional view of the TFT array panel shown in FIG. 13 taken along the line XIV-XIV.

Next, as shown in FIGS. 13 and 14, a plurality of blocking members 126 are formed on the organic semiconductor islands 154.

Subsequently, a conductive layer is deposited and patterned by lithography and etching to form a plurality of gate lines 121 including gate electrodes 124 and end portions 129.

An OTFT array panel for a liquid crystal display according to another embodiment of the present invention will be described in detail with reference to FIGS. 15 and 16.

Figure 15:
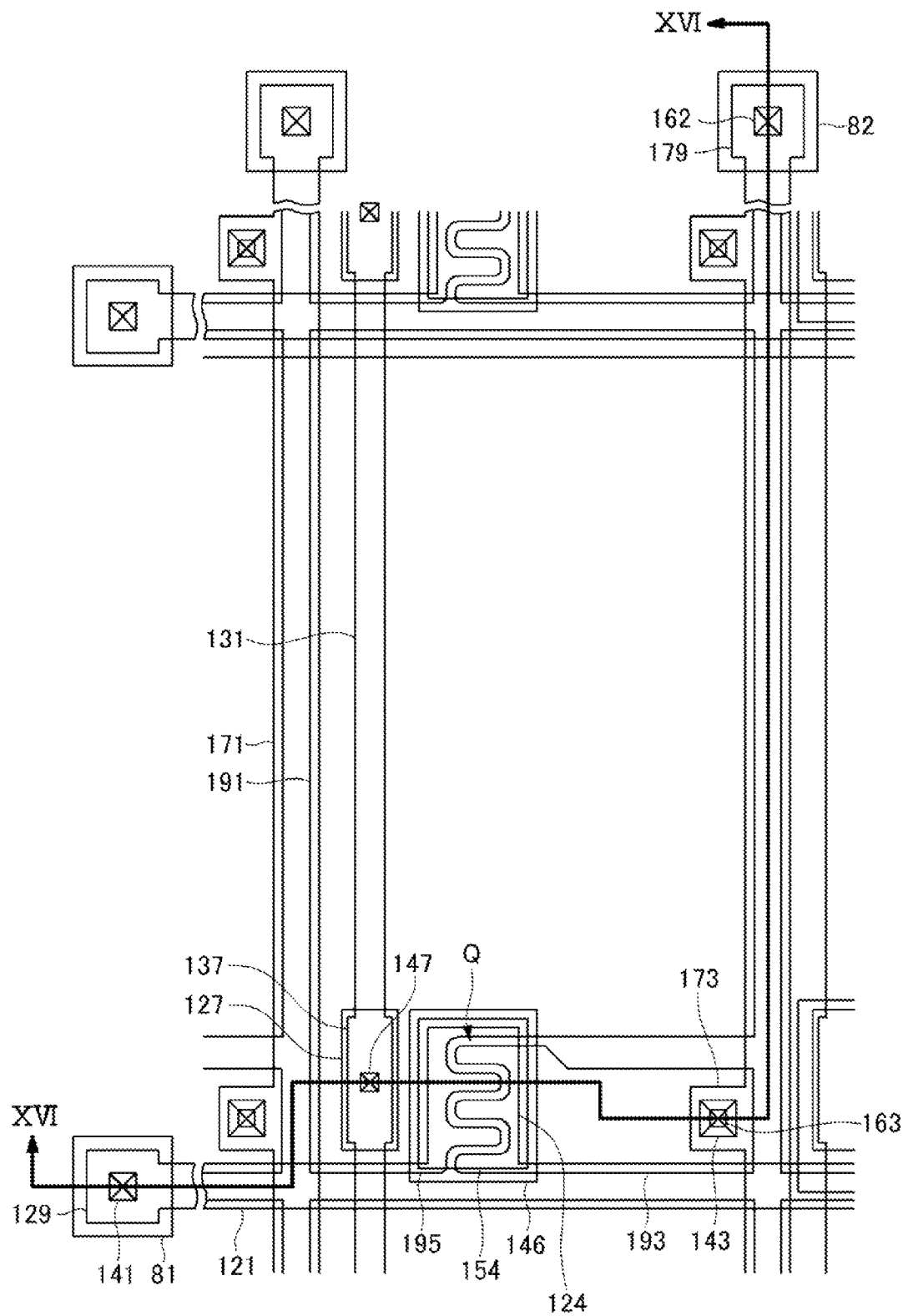
FIG. 15 is a layout view of an OTFT array panel according to another embodiment of the present invention.
Figure 16:
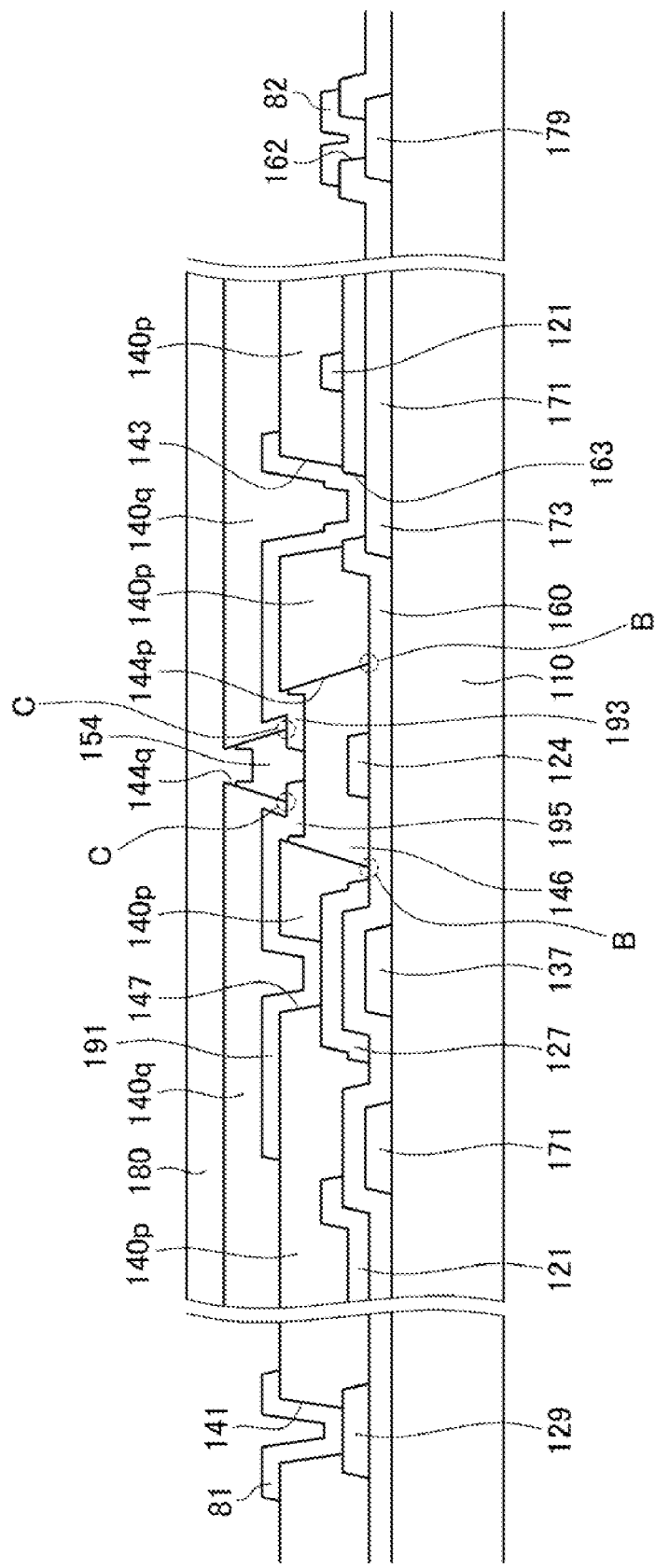
FIG. 16 is a sectional view of the OTFT array panel shown in FIG. 15 taken along the line XVI-XVI.

FIG. 15 is a layout view of an OTFT array panel according to another embodiment of the present invention, and FIG. 16 is a sectional view of the OTFT array panel shown in FIG. 15 taken along line XVI-XVI.

As shown in FIGS. 15 and 16, a plurality of data lines 171 and a plurality of storage electrode lines 131 are formed on a substrate 110.

Data lines 171 include a plurality of projections 173 projecting aside and an end portion 179 having a large area for contact with another layer or an external driving circuit.

Storage electrode lines 131 are supplied with a predetermined voltage and extend substantially parallel to data lines 171. Each of storage electrode lines 131 is disposed between two adjacent data lines 171 and is close to the left one of the two adjacent data lines 171. Each of storage electrode lines 131 includes a storage electrode 137 having a wide width. However, storage electrode lines 131 may have various shapes and arrangements.

An interlayer insulating layer 160 is formed on data lines 171 and storage electrode lines 131.

Interlayer insulating layer 160 has a plurality of contact holes 162 exposing the end portions 179 of data lines 171 and a plurality of contact holes 163 exposing the projections 173 of data lines 171.

A plurality of gate lines 121 and a plurality of assistant members 127 are formed on interlayer insulating layer 160.

The gate lines 121 include a plurality of gate electrodes 124 projecting upward and a plurality of end portions 129 having a large area for contact with another layer or an external driving circuit.

The assistant members 127 depart from the gate lines 121 and overlap the storage electrodes 137.

A lower partition 140p is formed on the substrate 110 including the gate lines 121 and the assistant members 127. The lower partition 140p may be made of an organic material, and the thickness of the lower partition 140p may be in the range of about 5000 angstroms to 4 microns.

The lower partition 140 has a plurality of contact holes 141, 143 and 147, and a plurality of lower openings 144p.

The end portions 129 and the assistant members 127 are respectively exposed through the contact holes 141 and 147, and the projections 173 of data lines 171 that are exposed through the contact holes 163 are exposed through the contact holes 143. The lower openings 144b expose the gate electrodes 124 and interlayer insulating layer 160.

The lower partition 140p has an inverse tapered structure with respect to the center line of the lower openings 144p. Accordingly, the lower width of the lower openings 144p is wider than the upper width thereof as shown in FIG. 16, and the surfaces of interlayer insulating layer 160 form an acute angle with the slanted surfaces of partition 140p in the edge portions B.

A plurality of gate insulators 146 are formed in the lower openings 144p of the lower partition 140p.

The gate insulators 146 may be made of an inorganic insulator or an organic insulator. Examples of the organic insulator include a soluble high molecule compound such as a polyimide compound, a polyvinyl alcohol compound, and parylene. Examples of the inorganic insulator include silicon oxide that may have a surface treated with octadecyl-trichloro-silane (OTS).

The gate insulators 146 can be formed by a solution process such as inkjet printing. The solution process includes the steps in which an organic solution is supplied and the organic solution is dried. Here, because the gate insulator solution is adhered closely to the lower partition 140p and is filled in the lower openings 144p, the gate insulators 146 have the same shapes as those of the lower openings 144p. On the other hand, because the volatilization velocities between the edge portion and the center portion of the gate insulators 146 are different, the thicknesses of the edge portion of the gate insulators 146 may be thick and the center portion may be thin and nonuniform.

In the embodiment of the present invention, because the lower partition 140 has an inverse tapered structure, the driven portion of the gate insulator solution is filled in the edge portions B and the flat surface is formed on the center portion of the gate insulators 146. Accordingly, although the gate insulators 146 is formed by the solution process such as inkjet printing, the center portion of the gate insulators 146 may have uniform thickness.

The height of the insulators 146 is smaller than that of the lower partition 140p to be completely confined in the lower partition 140p. Since the lateral surfaces of the organic semiconductor islands 154 are not exposed, chemicals used in later process steps are prevented from infiltrating the organic semiconductor islands 154.

A plurality of source electrodes 193, a plurality of pixel electrodes 191, and a plurality of contact assistants 81 and 82 are formed on the gate insulators 146 and the lower partition 140p.

Source electrodes 193 may be island shaped and are connected to data lines 171 through the contact holes 163 and 143.

Each of the pixel electrodes 191 includes a drain electrode 195 opposite a source electrode 193 with respect to a gate electrode 124, and receives data voltages from the organic TFT. The pixel electrode 191 includes at least the portion overlapping the storage electrode line 131 to form an additional capacitor referred to as a "storage capacitor," which enhances the voltage storing capacity of the liquid crystal capacitor.

The contact assistants 81 and 82 are connected to the end portions 129 and 179 of data lines 171 and the gate lines 121 through the contact holes 162 and 163, respectively.

An upper partition 140q is formed on source electrodes 193, the pixel electrodes 191, and the lower partition 140p.

The upper partition 140q may be made of an organic material, and the thickness of the upper partition 140q may be in the range of about 5000 angstroms to 4 microns.

The upper partition 140q has a plurality of upper openings 144q for exposing source electrodes 193 and the drain electrodes 195.

The upper partition 140q has an inverse tapered structure with respect to the center line of the upper openings 144q. Accordingly, the lower width of the upper openings 144q is wider than the upper width thereof as shown in FIG. 16, and the surfaces of source electrodes 193 and the drain electrodes 195 form an acute angle with the slanted surfaces of the upper partition 140q in the edge portions C.

A plurality of organic semiconductor islands 154 are formed in the upper openings 144q of the upper partition 140q.

The organic semiconductor islands 154 can be formed by a solution process such as inkjet printing. The solution process includes the steps in which an organic solution is supplied and dried. Here, because the organic semiconductor solution is adhere closely to the upper partition 140q and is filled in the upper openings 144q, the organic semiconductor islands 154 have the same shapes as those of the upper openings 144q. On the other hand, because the volatilization velocities between the center portion and the edge portion of the upper partitions 140q are different, the thicknesses of the organic semiconductor islands 154 may be different between the center portion and edge portion of the organic semiconductor islands 154 such that the thicknesses may be nonuniform.

In the embodiments according to the present invention, because the upper partition 140q has an inverse tapered structure, the thicker portion of the organic semiconductor islands 154 is filled in the edge portions C and the center portion of the organic semiconductor islands 154 in which the channel of thin film transistor is formed has the uniform thickness. Accordingly, although the organic semiconductor islands 154 are formed by the solution process such as inkjet printing, the channel portion of the organic semiconductor islands 154 may have uniform thickness such that the good characteristics of the thin film transistor may be maintained.

The organic semiconductor islands 154 contact source electrodes 193 and the drain electrodes 195, and the height of the organic semiconductor islands 154 is smaller than that of the upper partition 140q to be completely confined in the upper partition 140q. Since the lateral surfaces of the organic semiconductor islands 154 are not exposed, chemicals used in later process steps are prevented from infiltrating the organic semiconductor islands 154.

A gate electrode 124, a source electrode 193, a drain electrode 195, and an organic semiconductor island 154 form an organic TFT. The TFT has a channel formed in the organic semiconductor island 154 disposed between the source electrode 193 and the drain electrode 195. When the opposing sides of source electrodes 193 and the drain electrodes 195 are curved, the width of the organic TFT may be maximized such that the current characteristics of the organic TFT may be improved.

A plurality of passivation members 180 are formed on the organic semiconductor islands 154. The passivation members 180 protect the organic TFT from external heat, plasma, and chemicals, and may partially or completely cover the substrate 110. The passivation members 180 may be omitted.

Now, a method of manufacturing the OTFT array panel shown in FIGS. 15 and 16 according to an embodiment of the present invention will be described in detail with reference to FIGS. 17-29 as well as FIGS. 15 and 16.

Figure 17:
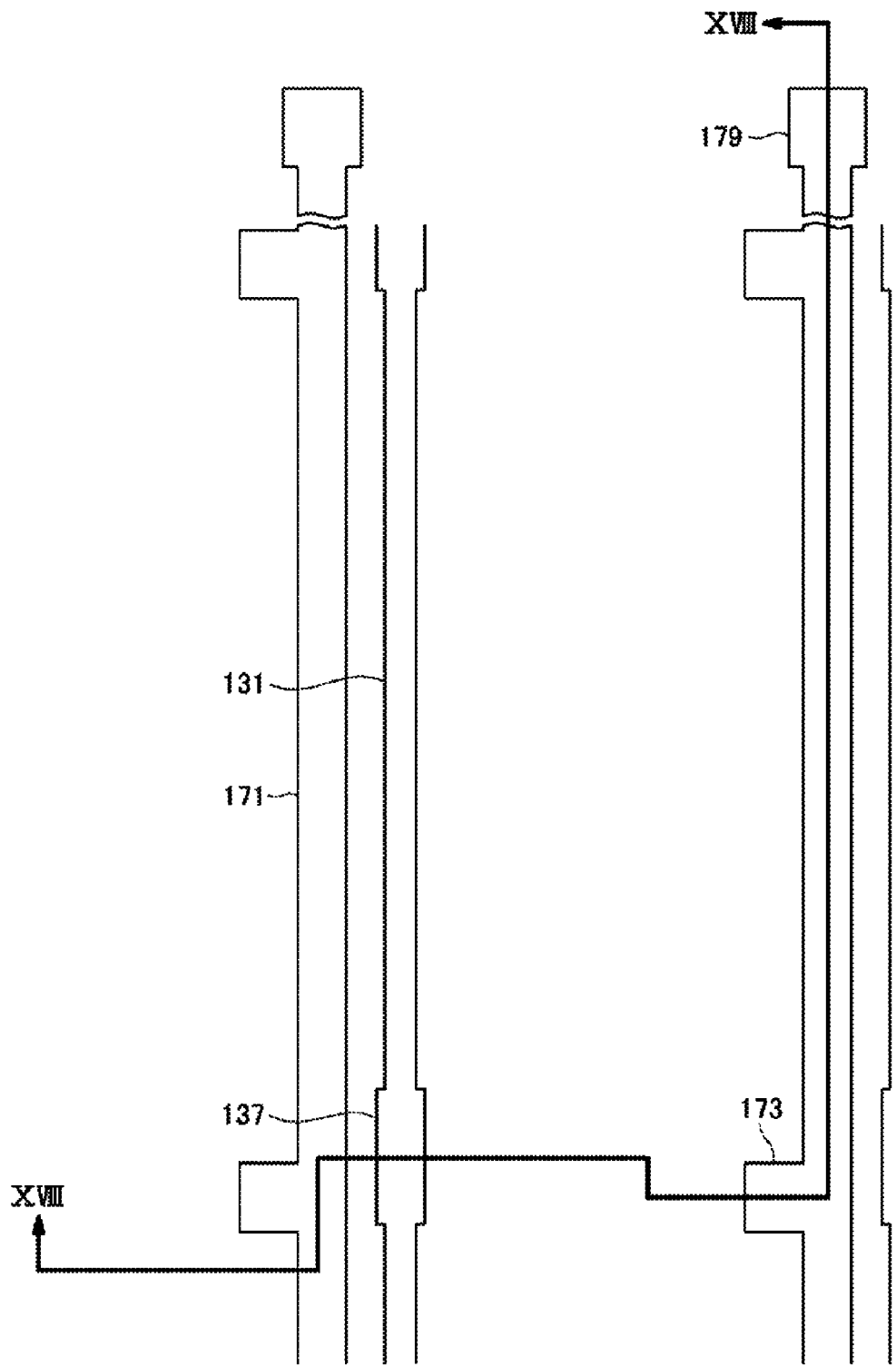
FIGS. 17, 19, 22, 24 and 28 are layout views of the OTFT array panel shown in FIGS. 15 and 16 in intermediate steps of a manufacturing method thereof according to an embodiment of the present invention.
Figure 18:
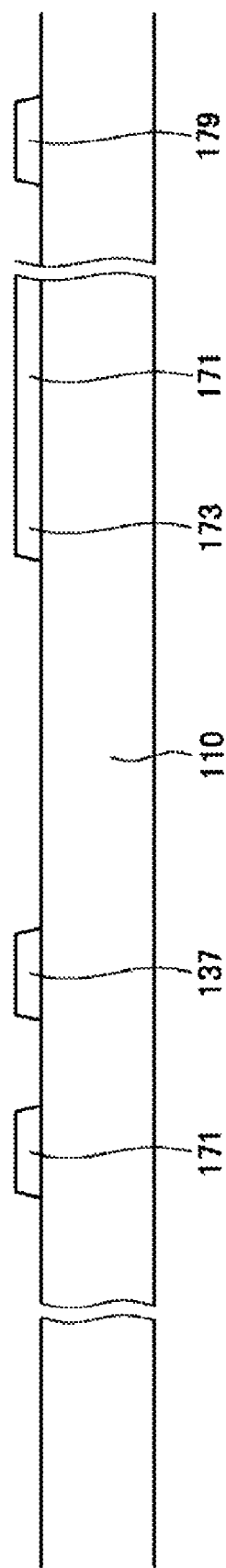
FIG. 18 is a sectional view of the OTFT array panel shown in FIG. 17 taken along the line XVIII-XVIII.
Figure 19:
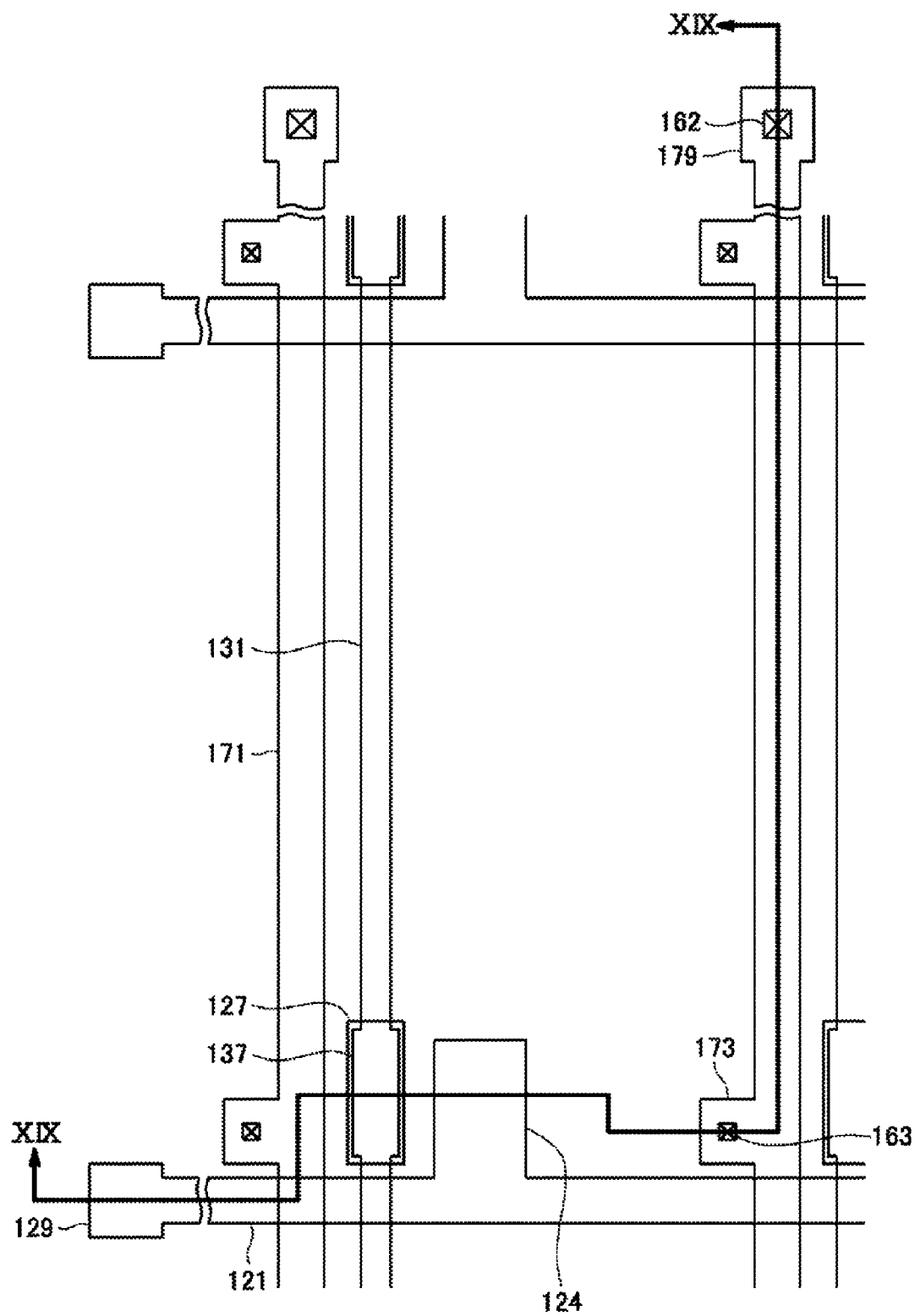
Figure 20:
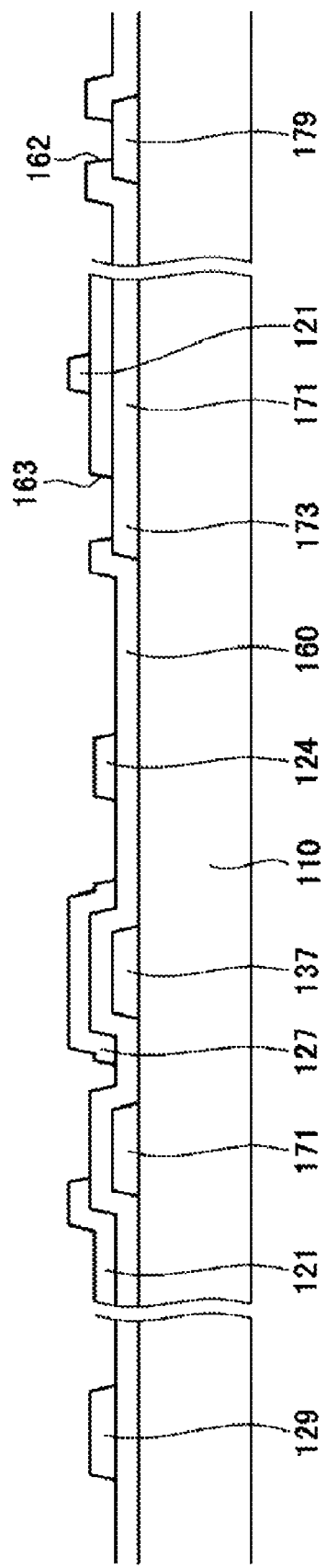
FIG. 20 is a sectional view of the OTFT array panel shown in FIG. 19 taken along the line XX-XX.
Figure 21:
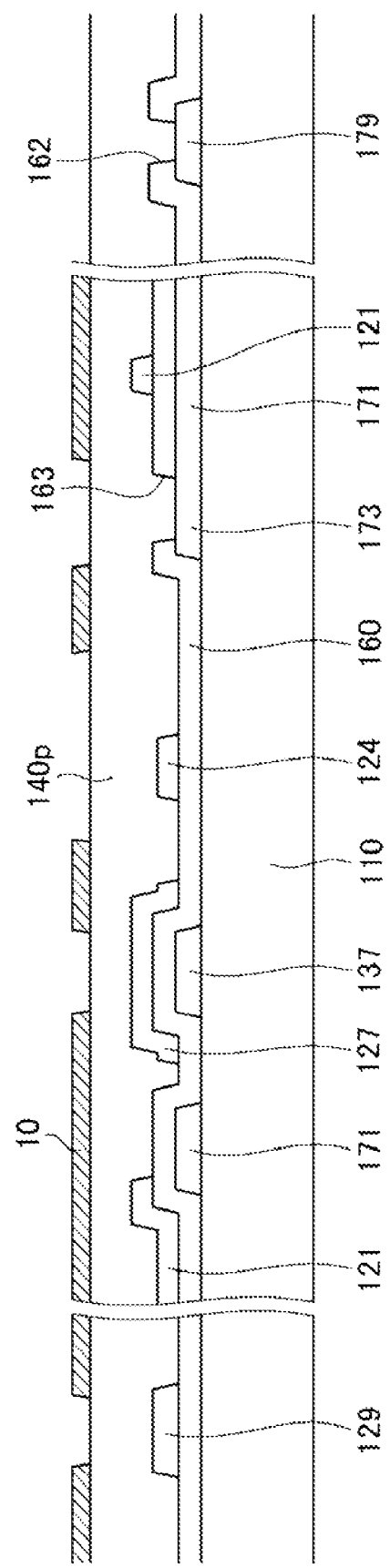
FIG. 21 is a sectional view of the TFT array panel following step of FIGS. 19 and 20.
Figure 23:
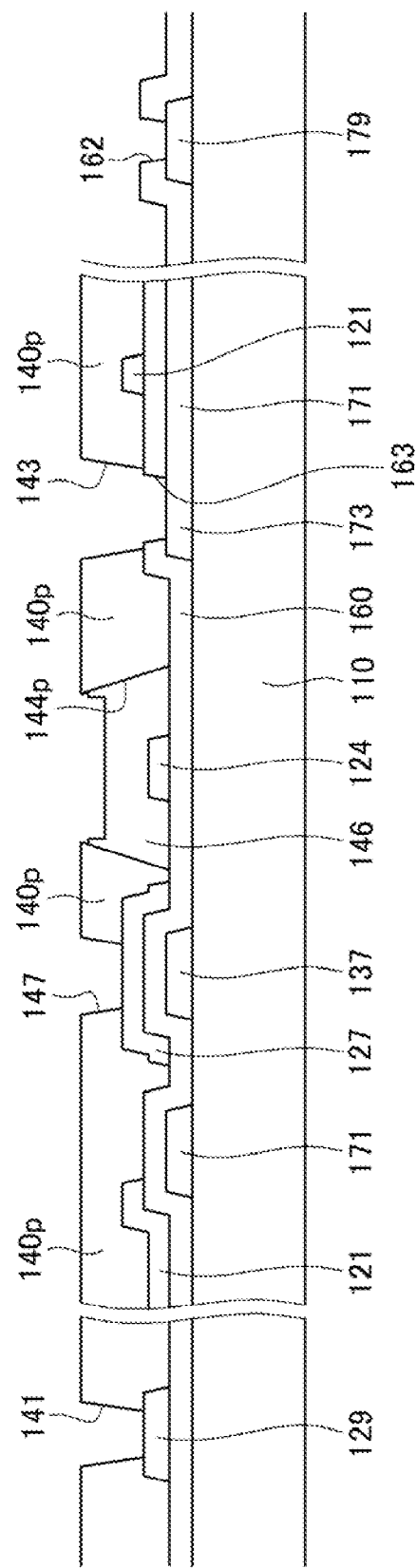
FIG. 23 is a sectional view of the OTFT array panel shown in FIG. 22 taken along the line XXII-XXII.
Figure 24:
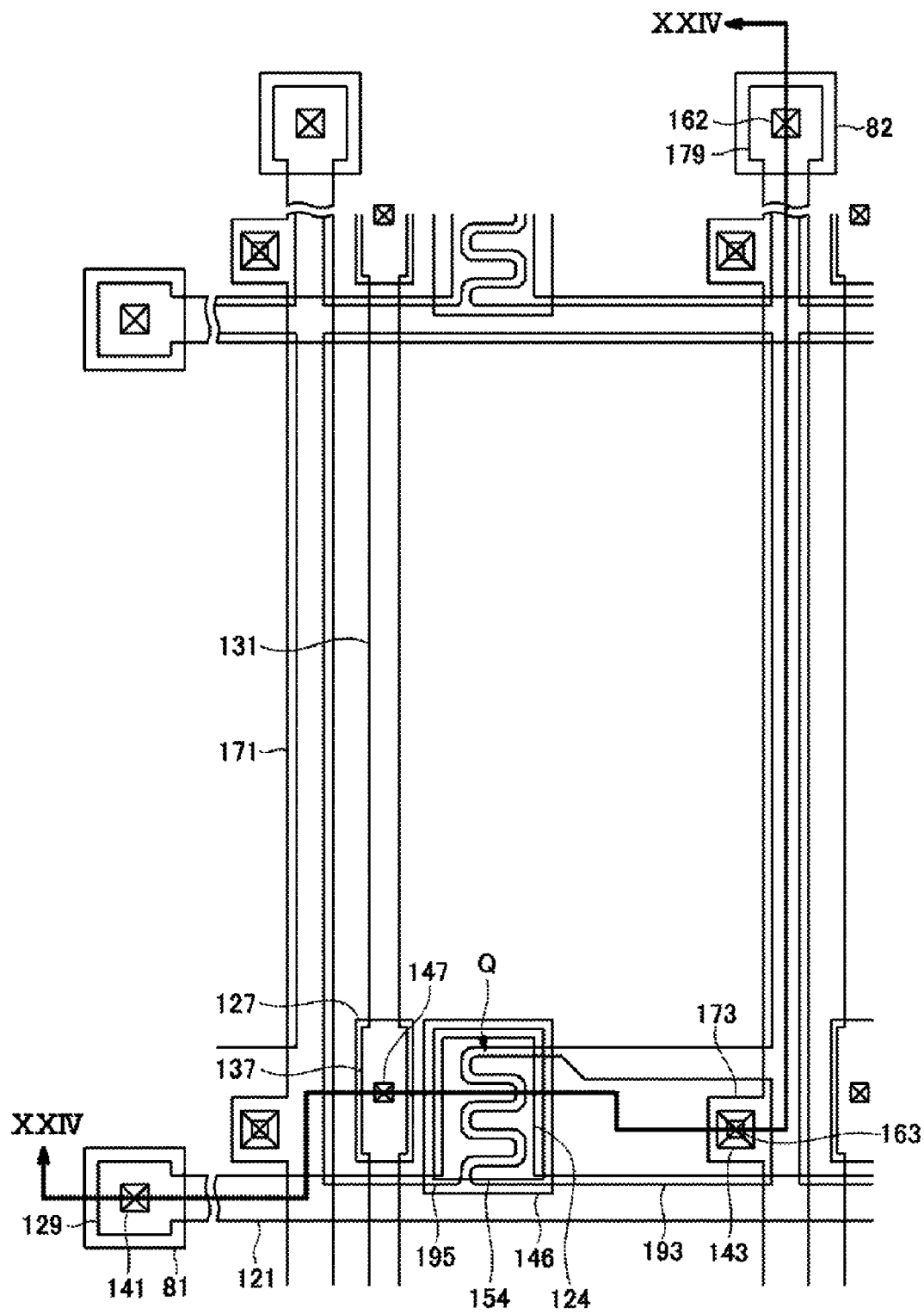
Figure 25:
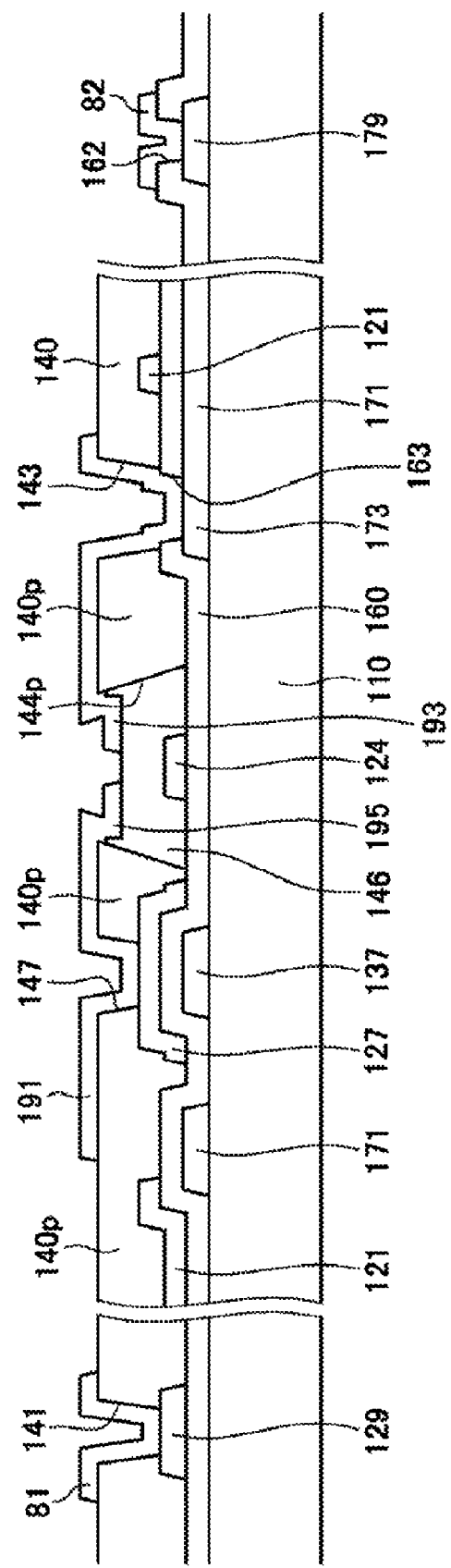
FIG. 25 is a sectional view of the TFT array panel shown in FIG. 24 taken along the line XXV-XXV.
Figure 26:
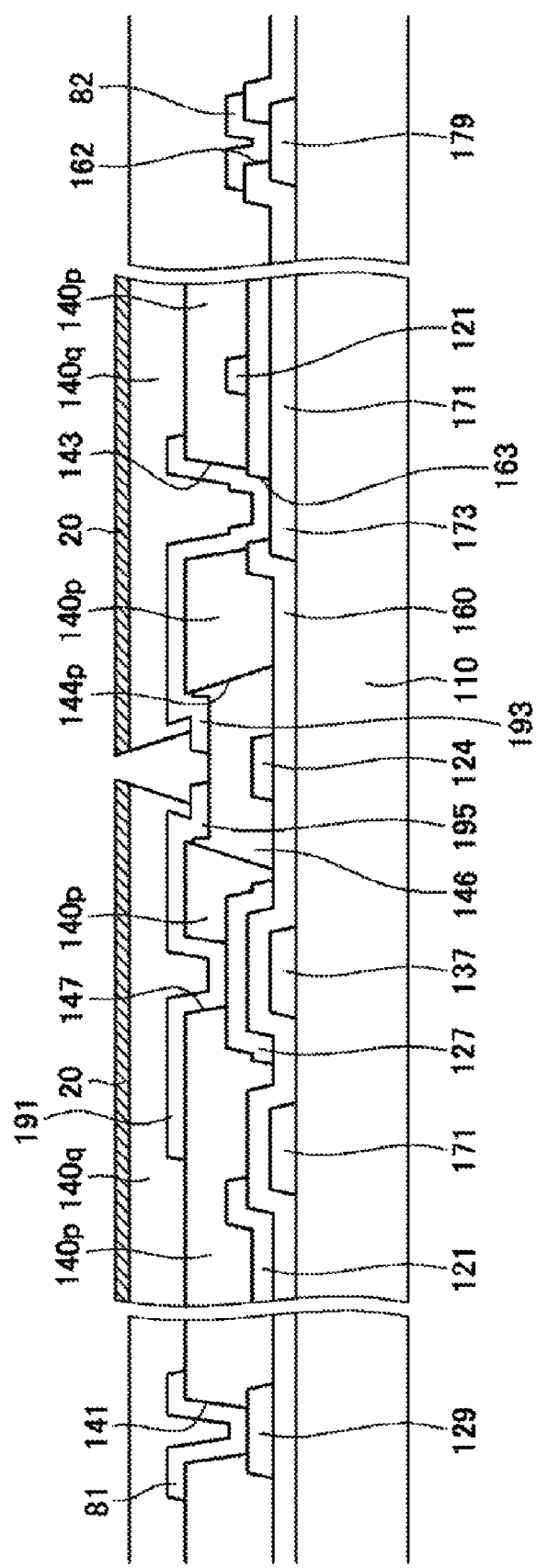
FIGS. 26 and 27 are sectional views of the TFT array panel following step of FIGS. 24 and 25.
Figure 27:
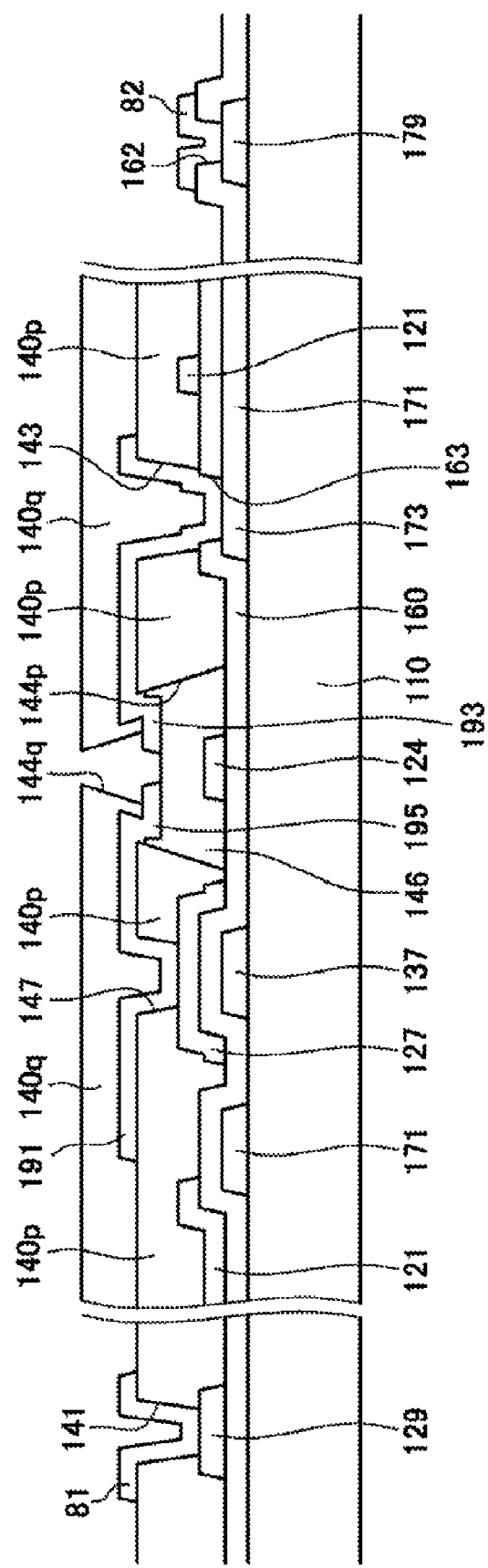

FIGS. 17, 19, 22, 24, and 28 are layout views of the OTFT array panel shown in FIGS. 15 and 16 in intermediate steps of a manufacturing method thereof according to an embodiment of the present invention, FIG. 18 is a sectional view of the OTFT array panel shown in FIG. 17 taken along the line XVIII-XVIII, and FIG. 20 is a sectional view of the OTFT array panel shown in FIG. 19 taken along the line XX-XX. FIG. 21 is a sectional view of the TFT array panel following step of FIGS. 19 and 20, FIG. 23 is a sectional view of the OTFT array panel shown in FIG. 22 taken along the line XXII-XXII, and FIG. 25 is a sectional view of the TFT array panel shown in FIG. 24 taken along the line XXV-XXV. FIGS. 26 and 27 are sectional views of the TFT array panel following step of FIGS. 24 and 25, and FIG. 29 is a sectional view of the OTFT array panel shown in FIG. 28 taken along the line XXIX-XXIX.

Referring to FIGS. 17 and 18, a conductive layer is deposited on a substrate 110 by using sputtering, etc., and is patterned by lithography and etching to form a plurality of data lines 171 including projections 173 and end portions 179, and a plurality of storage electrode lines 131 including a plurality of storage electrodes 137.

Referring to FIGS. 19 and 20, an interlayer insulating layer 160 including a plurality of contact holes 162 and 163 is formed by deposition and patterning. The deposition of interlayer insulating layer 160 is performed by CVD of an inorganic material such as silicon nitride.

Subsequently, a conductive layer is deposited and patterned by lithography and etching to form a plurality of gate lines 121 including gate electrodes 124 and end portions 129.

Then, as shown in FIG. 21, a lower organic layer 140p is coated on the substrate 110 and a metal layer is deposited thereon. Next, the metal layer is etched to form a metal pattern 10.

Figure 22:
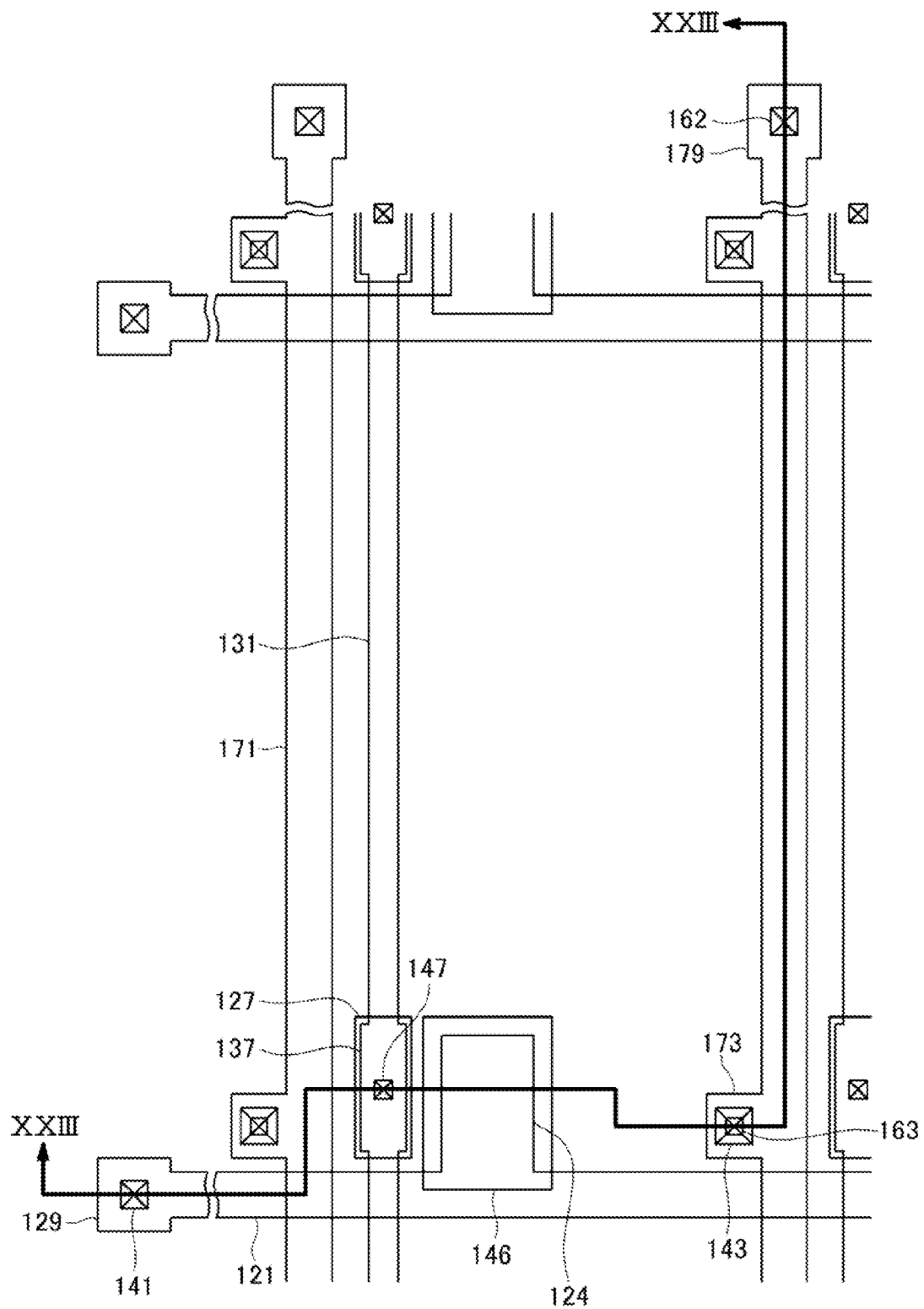

As shown in FIGS. 22 and 23, the lower organic layer 140p is then dry-etched by using the metal pattern 10 as an etch mask to form a lower partition 140p having a plurality of lower openings 144p and a plurality of contact holes 141, 143, and 147.

Successively, a plurality of gate insulators 146 are formed in the lower openings 144p. Inkjet printing, etc., may be used for this step.

Referring to FIGS. 24 and 25, an amorphous ITO layer or IZO layer is deposited by sputtering, etc., and patterned by lithography and etching to form a plurality of source electrodes 193, a plurality of pixel electrodes 191 including drain electrodes 195, and a plurality of contact assistants 81 and 82.

Subsequently, as shown in FIG. 26, an upper organic layer 140q is coated on the substrate 110 and a metal layer is deposited thereon. Next, the metal layer is etched to form a metal pattern 20.

As shown in FIG. 27, the upper organic layer 140q is then dry-etched by using the metal pattern 20 as an etch mask to form an upper partition 140q having a plurality of upper openings 144q.

Figure 28:
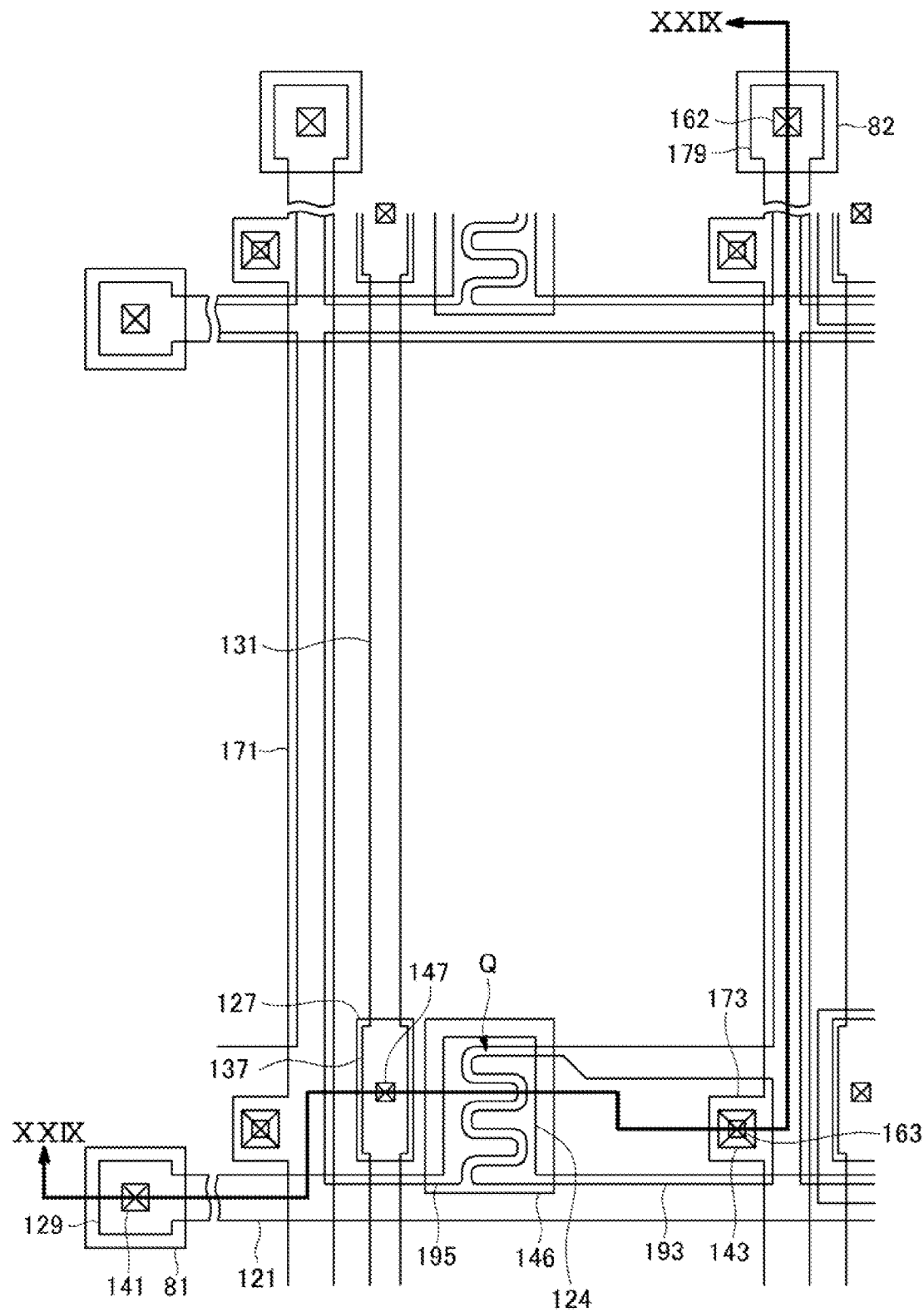
Figure 29:
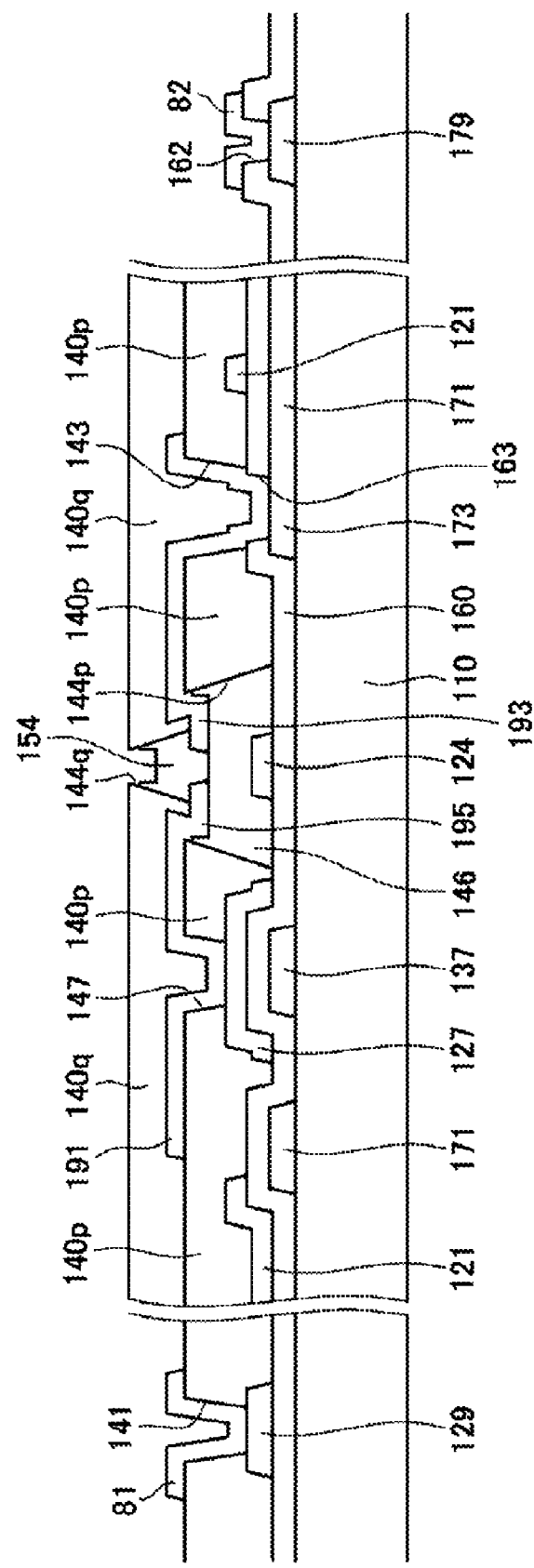
FIG. 29 is a sectional view of the OTFT array panel shown in FIG. 28 taken along the line XXIX-XXIX.

Referring to FIGS. 28 and 29, a plurality of organic semiconductor islands 154 are sequentially formed in the upper openings 144q by inkjet printing, etc. To form the organic semiconductor islands 154, a nozzle may be firstly aligned on the upper openings 144q, and an organic semiconductor solution may be supplied therethrough and dried.

As above-described, the upper and lower partitions 140p and 140q are etched to form the openings 144p and 144q by using the metal patterns 10 and 20, but a photoresist pattern may be used as a substitution for the metal patterns 10 and 20. The upper and the lower partitions 140p and 140q may be dry-etched to form the openings 144p and 144q by using the photoresist patterns.

Also, as the substitution for the metal pattern or the photoresist patterns, the upper and lower organic layers 140p and 140q may include a photosensitive material, and the upper and lower organic layers 140p and 140q may be exposed and developed to form the upper and lower openings 144p and 144q without etch steps. In this case, the blocking patterns of a mask may be aligned to the positions corresponding to the openings 144p and 144q of the upper and lower organic layers 140p and 140q, and the upper and lower organic layers 140p and 140q may be exposed and developed to form the upper and lower openings 144p and 144q having the inverse tapered structure.

Finally, as shown in FIGS. 15 and 16, a passivation member 180 is formed on the upper partition 140q and the organic semiconductor islands 154.

As above-described, the thickness of the organic semiconductor in which the channel is formed may be uniform, and accordingly the characteristics of an organic TFT may be improved.

Although preferred embodiments of the present invention have been described in detail hereinabove, it should be understood that many variations and/or modifications of the basic inventive concepts will be apparent to those skilled in the art and may be made without, however, departing from the spirit and scope of the invention.

What is claimed is:

1. A method of manufacturing a thin film transistor array panel, the method comprising:
    forming a first signal line on a substrate;
    forming an interlayer insulating layer covering the first signal line and having a plurality of contact holes;
    forming a source electrode connected to the first signal line through the contact holes and a pixel electrode having a drain electrode opposite the source electrode;
    forming an organic layer on the source electrode and the pixel electrode;
    etching the organic layer to form an opening, wherein a lower width of the opening is wider than an upper width of the opening;
    forming a semiconductor in the opening, wherein the semiconductor contacts a portion of sides of the organic layer;
    forming a gate insulator on the semiconductor; and
    forming a second signal line including a gate electrode on the gate insulator.

2. The method of claim 1, wherein a solution is supplied in the opening and is dried to form one of the semiconductor and the gate insulator.

3. The method of claim 1, wherein the organic layer includes a negative photosensitive material.

4. The method of claim 1, wherein the organic layer is dry-etched to form the opening.

5. The method of claim 1, wherein the formation of the opening includes:
    depositing a metal layer on the organic layer;
    etching the metal layer to form a metal pattern;
    dry-etching the organic layer to form the opening; and
    removing the metal pattern.

6. The method of claim 1, wherein the metal layer includes a different material from that of the source electrode and the drain electrode.

7. A method of manufacturing a thin film transistor array panel, the method comprising:
    forming a data line on a substrate;
    forming an interlayer insulating layer covering the data line and having a first contact hole;
    forming a gate line on the interlayer insulating layer;
    forming a first partition having a first inverse tapered structure and a first opening on the gate line;
    forming a gate insulator in the first opening;
    forming a source electrode and a pixel electrode having a drain electrode opposite the source electrode on the gate insulator and the first partition;
    forming a second partition having a second inverse tapered structure and a second opening on the source electrode and the pixel electrode; and
    forming a semiconductor in the second opening, wherein the semiconductor contacts a portion of sides of the second partition.

8. The method of claim 7, wherein a solution is supplied in the opening and is dried to form one of the semiconductor and the gate insulator.

9. The method of claim 7, wherein at least one of the first partition and the second partition include a negative photosensitive material.

10. The method of claim 7, wherein the first partition and the second partition are dry-etched to form the first opening and the second opening.

11. The method of claim 7, wherein the semiconductor is an organic semiconductor.

12. The method of claim 1, wherein the semiconductor is an organic semiconductor.

* * * * *